(12) United States Patent
Baburske et al.

(10) Patent No.: US 10,381,467 B2
(45) Date of Patent: *Aug. 13, 2019

(54) SEMICONDUCTOR DEVICE WITH SEPARATION REGIONS

(71) Applicant: Infineon Technologies AG, Neubiberg (DE)

(72) Inventors: Roman Baburske, Otterfing (DE); Matteo Dainese, Villach (AT); Peter Lechner, Holzkirchen (DE); Hans-Joachim Schulze, Taufkirchen (DE); Johannes Georg Laven, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/858,217

(22) Filed: Dec. 29, 2017

(65) Prior Publication Data
US 2018/0145161 A1  May 24, 2018

Related U.S. Application Data

(63) Continuation of application No. 14/963,456, filed on Dec. 9, 2015, now Pat. No. 9,876,100, which is a (Continued)

(51) Int. Cl.
H01L 29/04 (2006.01)
H01L 29/06 (2006.01)
(Continued)

(52) U.S. Cl.
CPC ...... *H01L 29/7393* (2013.01); *H01L 29/0696* (2013.01); *H01L 29/407* (2013.01);
(Continued)

(58) Field of Classification Search
CPC .................. H01L 29/7393; H01L 21/8222
See application file for complete search history.

(56) References Cited

U.S. PATENT DOCUMENTS 6,060,747 A    5/2000  Okumura et al.
6,566,691 B1   5/2003  Inoue et al.
(Continued)

FOREIGN PATENT DOCUMENTS

CN    101840919 A      9/2010
DE    112011100533 T5  12/2012
JP    2012227255 A     11/2012

*Primary Examiner* — Farun Lu
(74) *Attorney, Agent, or Firm* — Murphy, Bilak & Homiller, PLLC

(57) ABSTRACT

According to an embodiment of a semiconductor device, the device includes first and second trenches formed in a semiconductor body and an electrode disposed in each of the trenches. One of the electrodes is a gate electrode, and the other electrode is electrically disconnected from the gate electrode. The semiconductor device further includes a semiconductor mesa between the trenches. The semiconductor mesa includes a separation region and at least one of a source region and a body region located in the semiconductor mesa. A drift zone is provided below the at least one of the source region and the body region. In the separation region, at least one of (i) a capacitive coupling between the gate electrode and the semiconductor mesa and (ii) a conductivity of majority charge carriers of the drift zone is lower than outside of the separation region.

12 Claims, 18 Drawing Sheets

Related U.S. Application Data continuation of application No. 14/275,193, filed on May 12, 2014, now Pat. No. 9,231,091.

(51) Int. Cl.
  *H01L 29/10* (2006.01)
  *H01L 29/40* (2006.01)
  *H01L 29/66* (2006.01)
  *H01L 29/423* (2006.01)
  *H01L 29/739* (2006.01)
  *H01L 29/861* (2006.01)

(52) U.S. Cl.
  CPC .... *H01L 29/4238* (2013.01); *H01L 29/42368* (2013.01); *H01L 29/7395* (2013.01); *H01L 29/7397* (2013.01); *H01L 29/045* (2013.01); *H01L 29/0619* (2013.01); *H01L 29/1095* (2013.01); *H01L 29/6634* (2013.01); *H01L 29/66333* (2013.01); *H01L 29/66348* (2013.01); *H01L 29/7396* (2013.01); *H01L 29/8613* (2013.01); *H01L 2924/13055* (2013.01)

(56) References Cited

U.S. PATENT DOCUMENTS

| | | |
|---|---|---|
| 7,075,147 B2 | 7/2006 | Cao |
| 7,598,566 B2 | 10/2009 | Hotta et al. |
| 8,344,480 B2 * | 1/2013 | Seok ................... H01L 29/0696 257/565 |
| 8,633,510 B2 | 1/2014 | Matsuura et al. |
| 8,746,702 B1 | 6/2014 | Benedict |
| 8,853,774 B2 | 10/2014 | Cotorogea et al. |
| 8,994,102 B2 | 3/2015 | Hikasa |
| 9,876,100 B2 * | 1/2018 | Baburske ............ H01L 29/7393 |
| 2005/0006700 A1 | 1/2005 | Cao |
| 2009/0283799 A1 * | 11/2009 | Ruething ............ H01L 29/0834 257/143 |
| 2010/0078674 A1 | 4/2010 | Seok et al. |
| 2010/0155773 A1 | 6/2010 | Parthasarathy et al. |
| 2012/0292662 A1 | 11/2012 | Matsuura et al. |
| 2013/0181283 A1 | 7/2013 | Sato |
| 2014/0054644 A1 | 2/2014 | Hikasa |
| 2014/0070270 A1 | 3/2014 | Yoshida et al. |
| 2015/0221756 A1 | 8/2015 | Vellei et al. |

\* cited by examiner

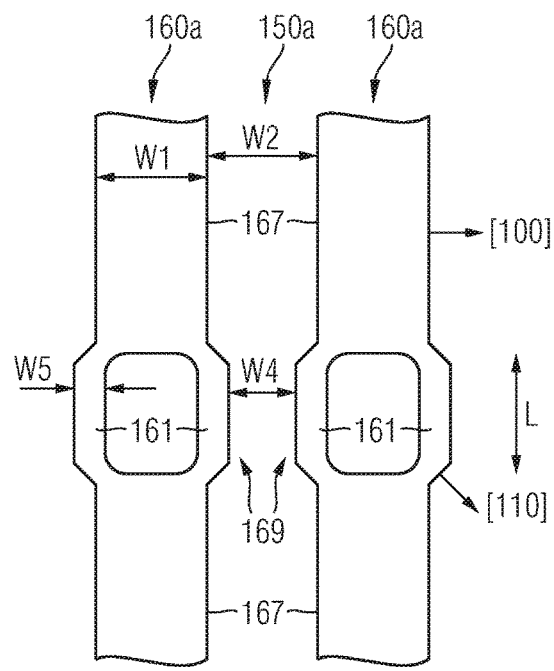
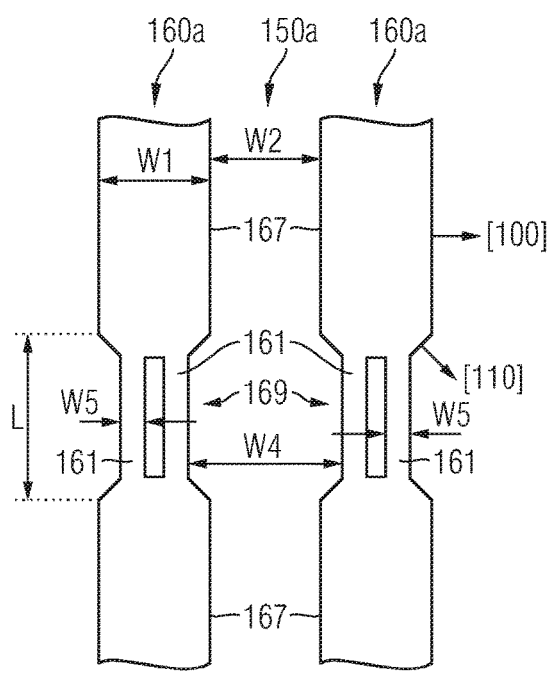
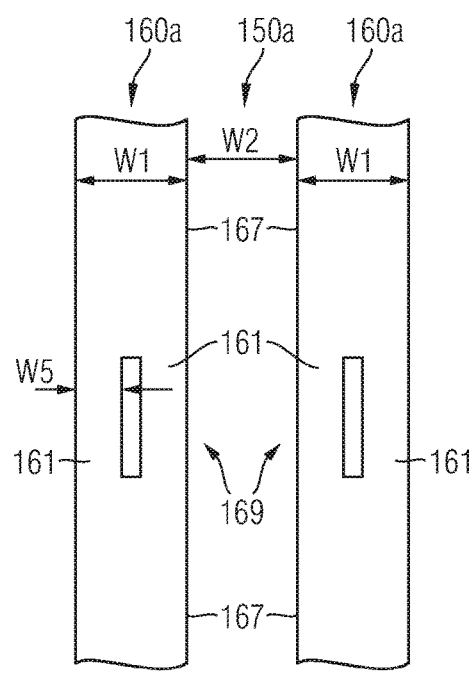

SEMICONDUCTOR DEVICE WITH SEPARATION REGIONS

BACKGROUND

In semiconductor switching devices like IGBTs (insulated gate bipolar transistors) as well as RC-IGBTs (reverse conducting IGBTs) mobile charge carriers flood a low-doped drift zone and form a charge carrier plasma that provides a low on-state resistance. For achieving high short-circuit robustness, source zones are formed only in portions of the cell area in order to limit the maximum short-circuit current. On the other hand, reducing the source zone area may adversely affect the charge carrier plasma in the drift zone. It is desirable to provide semiconductor devices with improved switching characteristics.

SUMMARY

According to an embodiment a semiconductor device includes a semiconductor mesa including at least one body zone forming first pn junctions with source zones and a second pn junction with a drift zone. A pedestal layer at a side of the drift zone opposite to the at least one body zone includes first zones of a conductivity type of the at least one body zone and second zones of the conductivity type of the drift zone. Electrode structures are arranged on opposite sides of the semiconductor mesa. At least one of the electrode structures includes a gate electrode configured to control a charge carrier flow through the at least one body zone. A separation region is arranged between two of the source zones, respectively. In the separation region (i) a capacitive coupling between the gate electrode and the semiconductor mesa is lower than outside of the separation region or (ii) a conductivity of majority charge carriers of the drift zone is lower than outside of the separation region.

According to another embodiment an RC-IGBT (reverse conducting insulated gate bipolar transistor) includes a semiconductor mesa that includes at least one body zone forming first pn junctions with source zones and a second pn junction with a drift zone. Electrode structures are arranged on opposite sides of the semiconductor mesa. At least one of the electrode structures includes a gate electrode configured to control a charge carrier flow through the at least one body zone. A separation region is between two of the source zones, respectively. In the separation region (i) a capacitive coupling between the gate electrode and the semiconductor mesa is lower than outside of the separation region or (ii) a conductivity of majority charge carriers of the drift zone is lower than outside of the separation region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 13F is a schematic plan view of a layout for precursor semiconductor mesas according to an embodiment providing widely spaced mesa branches as constricted portions.

FIG. 13G is a schematic plan view of a layout for precursor semiconductor mesas according to an embodiment providing narrowly spaced mesa branches as constricted portions.

FIG. 13H is a schematic plan view of a layout for precursor semiconductor mesas according to a further embodiment providing mesa branches as constricted portions.

DETAILED DESCRIPTION

Figure 1A:
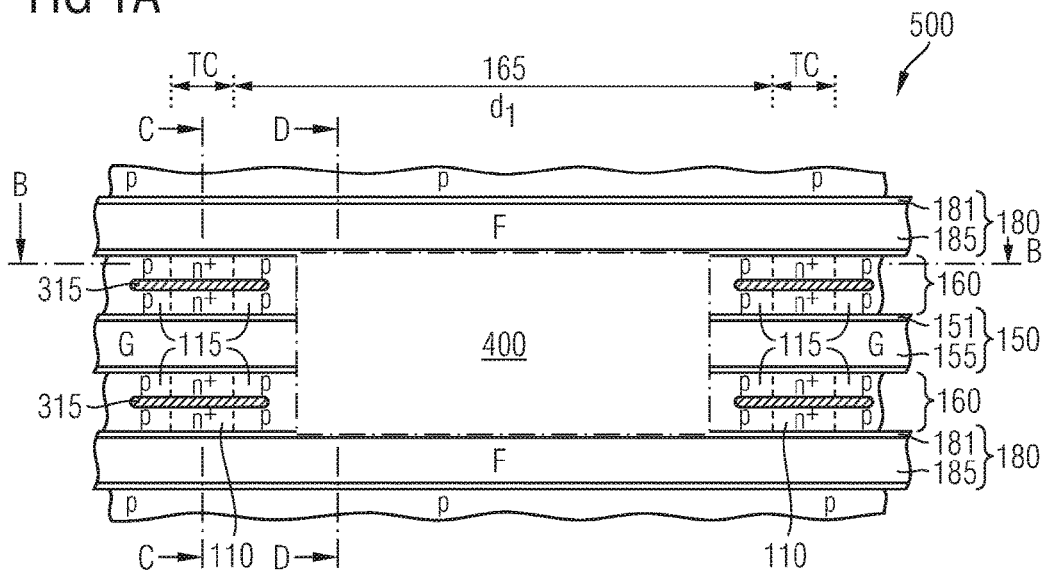
FIG. 1A is a schematic lateral cross-sectional view of a portion of a semiconductor device with a separation region between neighboring source zones in accordance with an embodiment.
Figure 1B:
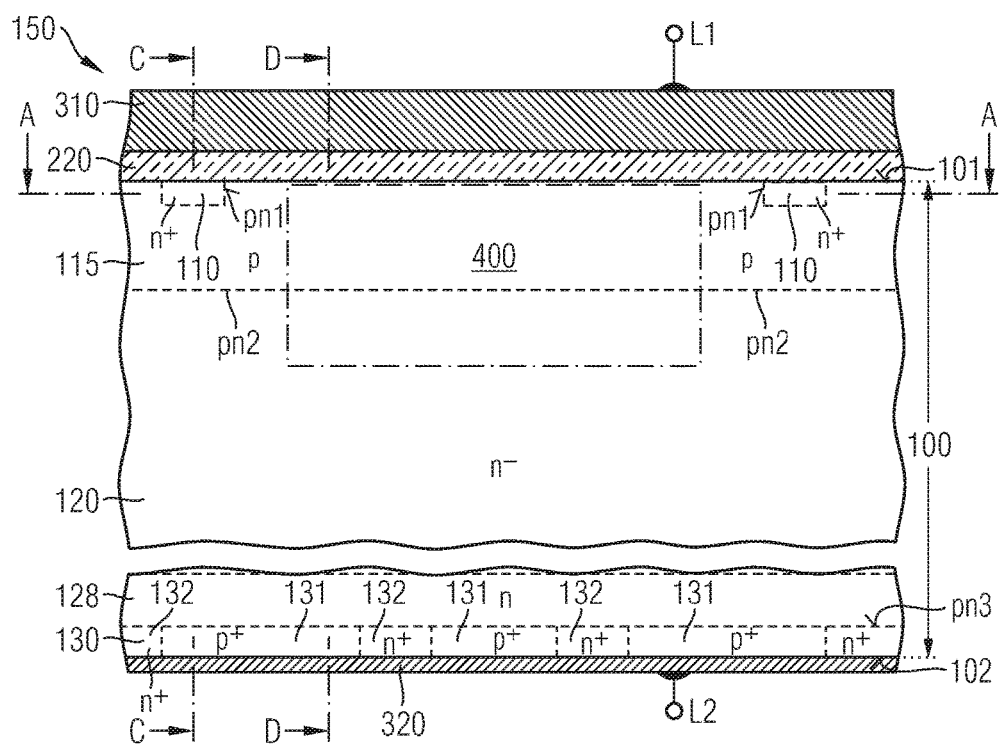
FIG. 1B is a schematic cross-sectional view of the semiconductor device portion of FIG. 1A along line B-B.
Figure 1C:
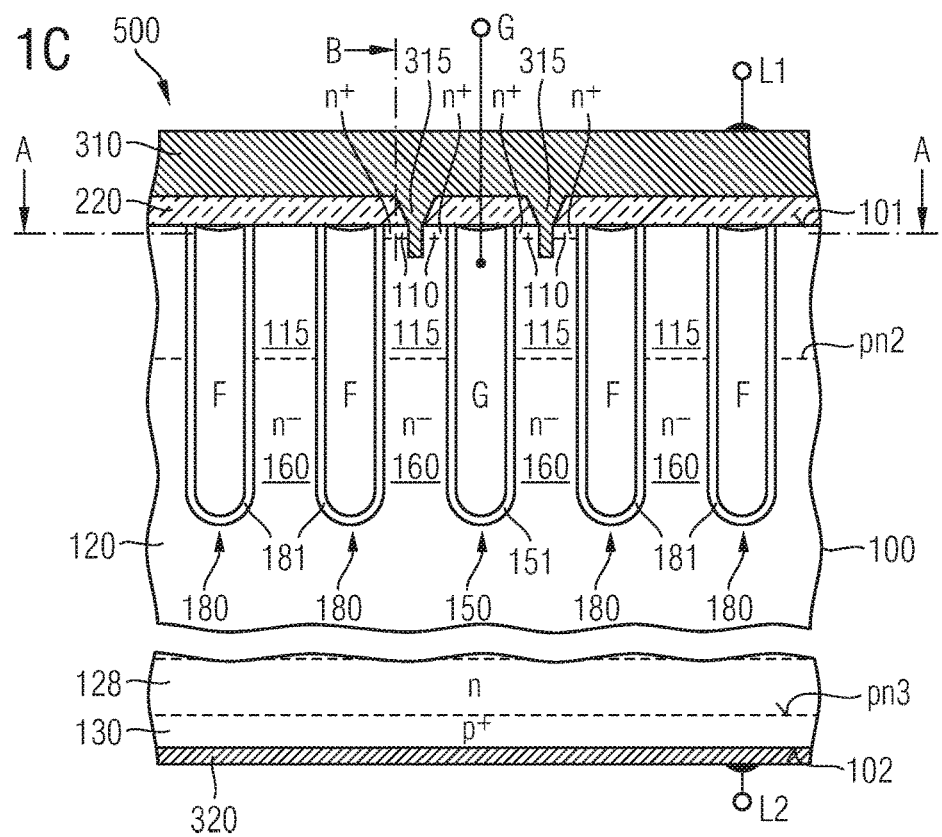
FIG. 1C is a schematic cross-sectional view of the semiconductor device portion of FIG. 1A along line C-C.
Figure 1D:
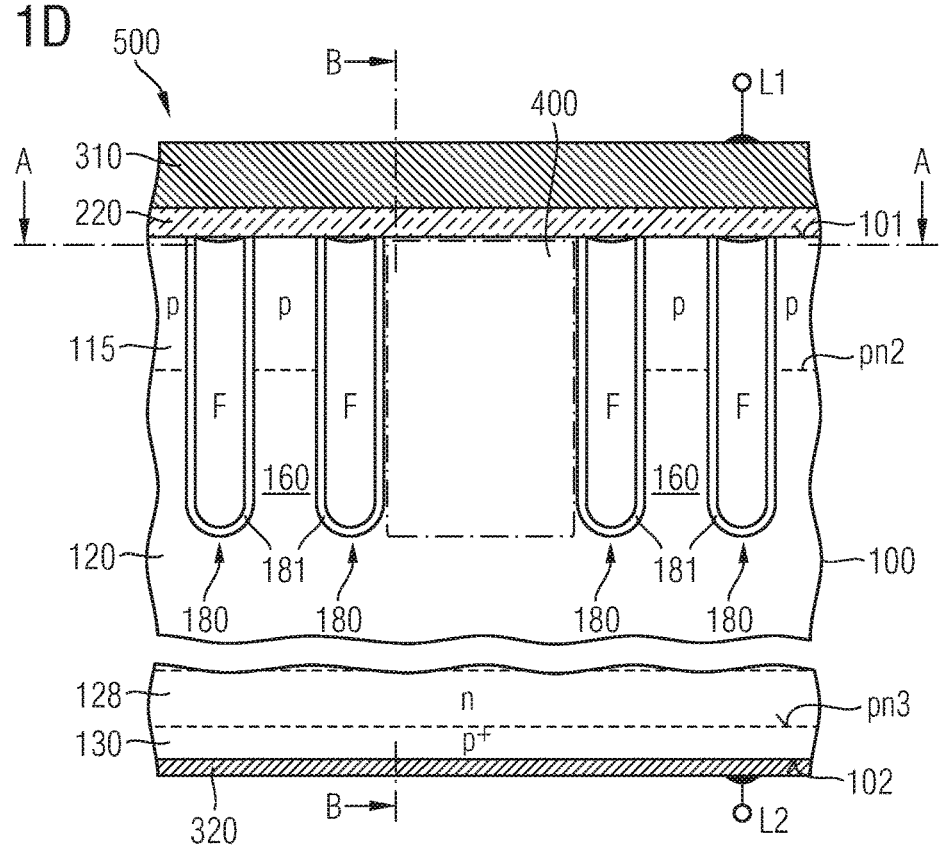
FIG. 1D is a schematic cross-sectional view of the semiconductor device portion of FIG. 1A along line D-D.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D illustrate a portion of a semiconductor device 500 including a separation structure 400 between neighboring isolated source zones 110 assigned to the same semiconductor mesa 160.

The semiconductor device 500 may be a semiconductor diode, for example an MCD (MOS controlled diode), or an RC-IGBT (reverse conducting insulated gate bipolar transistor). A semiconductor body 100 of the semiconductor device 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be defined by a plane spanned by coplanar surface sections, as well as a mainly planar second surface 102 parallel to the first surface 101. A minimum distance between the first and second surfaces 101, 102 depends on the voltage blocking capability specified for the semiconductor device 500. For example, the distance between the first and second surfaces 101, 102 may be in a range from 90 μm to 120 μm for a semiconductor device specified for a blocking voltage of about 1200 V. Other embodiments related to semiconductor devices with high blocking capabilities may provide semiconductor bodies 100 with a thickness of several 100 μm. For semiconductor devices with lower blocking voltage the thickness may be in a range from 35 μm to 90 μm.

In a plane parallel to the first surface 101 the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift zone 120 of a first conductivity type, a body zone 115 of a second conductivity type, which is opposite to the first conductivity type, between the first surface 101 and the drift zone 120 as well as a pedestal layer 130 between the drift zone 120 and the second surface 102.

For the illustrated embodiments the first conductivity type is the n-type and the second conductivity type is the p-type. Similar considerations as outlined below apply to embodiments with the first conductivity type being the p-type and the second conductivity type being the n-type.

An impurity concentration in the drift zone 120 may gradually or in steps increase or decrease with increasing distance to the first surface 101 at least in portions of its vertical extension. According to other embodiments the impurity concentration in the drift zone 120 may be approximately uniform. For IGBTs based on silicon, a mean impurity concentration in the drift zone 120 may be between $5 \times 10^{12}$ (5E12) cm$^{-1}$ and $1 \times 10^{15}$ (1E15) cm$^{-3}$, for example in a range from $1 \times 10^{13}$ (1E13) cm$^{-3}$ to $1 \times 10^{14}$ (1E14) cm$^{-3}$. In the case of a semiconductor device based on SiC, a mean impurity concentration in the drift zone 120 may be between $5 \times 10^{14}$ (5E14) cm$^{-3}$ and $1 \times 10^{17}$ (1E17) cm$^{-3}$, for example in a range from $1 \times 10^{15}$ (1E15) cm$^{-3}$ to $1 \times 10^{16}$ (1E16) cm$^{-3}$.

The pedestal layer 130 may include first zones 131 of the conductivity type of the body zones 115 and second zones 132 of the conductivity type of the drift zone 120. The impurity concentrations in the first and second zones 131, 132 are sufficiently high for forming an ohmic contact with a metal directly adjoining the second surface 102. A mean impurity concentration for the p-type first zones 131 of the pedestal layer 130 may be at least $1 \times 10^{16}$ (1E16) cm$^{-3}$, for example at least $5 \times 10^{17}$ (5E17) cm$^{-3}$.

A field stop layer 128 of the first conductivity type may separate the pedestal layer 130 from the drift zone 120, wherein a mean net impurity concentration in the field stop layer 128 may be lower than the impurity concentration in the pedestal layer 130 by at least one order of magnitude and may be higher than in the drift zone 120 by at least one order of magnitude.

The first and second zones 131, 132 of the pedestal layer 130 may extend from the second surface 102 to the field stop layer 128 or, in absence of a field stop layer, to the drift zone 120, respectively. The first zones 131 may be dots laterally embedded by connected second zones 132 or vice versa. According to other embodiments, the first and second zones 131, 132 are stripes running parallel to a first lateral direction or orthogonal to the first lateral direction.

Electrode structures 150, 180 extend from the first surface 101 into the drift zone 120. Portions of the semiconductor body 100 between neighboring electrode structures 150, 180 form semiconductor mesas 160.

The electrode structures 150, 180 may be stripes extending along an extension direction of the semiconductor mesas 160. According to an embodiment, the extension direction may be exclusively parallel to the first lateral direction such that the semiconductor mesas 160 and electrode structures 150, 180 are straight stripe structures. According to another embodiment, the extension direction alters with respect to the first lateral direction such that the semiconductor mesas 160 and electrode structures 150, 180 form staggered or zigzag stripes. The semiconductor mesas 160 may be regularly arranged at a uniform pitch (center-to-center distance) of, for example, 400 nm to 20 μm, for example 800 nm to 2 μm.

Active electrode structures 150 may include a gate electrode 155 and a gate dielectric 151 separating the gate electrode 155 from the semiconductor body 100. The gate electrode 155 may be a homogenous structure or may have a layered structure including one or more conductive layers. According to an embodiment the gate electrode 155 may include or consist of heavily doped polycrystalline silicon.

The gate dielectric 151 may include or consist of a semiconductor oxide, for example thermally grown or deposited silicon oxide, a semiconductor nitride, for example deposited or thermally grown silicon nitride, or a semiconductor oxynitride, for example silicon oxynitride.

Passive electrode structures 180 may include a field electrode 185 and a field dielectric 181 separating the field electrode 185 from the semiconductor body 100. The field electrode 185 may be a homogenous structure or may have a layered structure including one or more conductive layers. According to an embodiment, the field electrode 185 may include or consist of a heavily doped polycrystalline silicon layer. The field electrode 185 and the gate electrode 155 may have the same configuration and may include the same materials.

The field dielectric 181 may include or consist of a semiconductor oxide, for example thermally grown or deposited silicon oxide, a semiconductor nitride, for example deposited or thermally grown silicon nitride, or a semiconductor oxynitride, for example silicon oxynitride. The field and gate dielectrics 151, 181 may have the same configuration and/or may include the same materials.

Active and passive electrode structures 150, 180 may alternate in a regular fashion. For example, one single passive electrode structure 180 may be arranged between each pair of active electrode structures 150. According to other embodiments, two, three or more passive electrode structures 180 may be arranged between each pair of active electrode structures 150. The respective arrangement of active and passive electrode structures 150, 180 may vary over a lateral direction of the semiconductor body 100. E.g., the number of passive electrode structures 180 between each pair of active electrode structures 150 may increase or decrease continuously or stepwise with decreasing distance to an edge termination area of the semiconductor body 100. A further embodiment may exclusively include active electrode structures 150.

The gate electrodes 155 may be electrically connected to a gate terminal G of the semiconductor device 500. The field electrodes 185 may be electrically connected to an auxiliary terminal of the semiconductor device 500 or may be electrically connected with one of the load electrodes of the semiconductor device 500. For example, the field electrodes 185 may be electrically connected or coupled to the IGBT emitter electrode.

A distance between the first surface 101 and a bottom of the electrode structures 150, 180 may range from 1 μm to 30 μm, e.g., from 3 μm to 7 μm. A lateral width of the semiconductor mesas 160 may range from 0.05 μm to 10 μm, e.g., from 0.1 μm to 1 μm.

The body zones 115 are formed in first sections of the semiconductor mesas 160 oriented to the first surface 101 and may directly adjoin to the first surface 101 in sections of each semiconductor mesa 160. A mean net impurity concentration in the body zones 115 may be in the range from $1 \times 10^{16}$ (1E16) cm$^{-3}$ to $5 \times 10^{18}$ (5E18) cm$^{-3}$, for example between $1 \times 10^{17}$ (1E17) cm$^{-3}$ and $5 \times 10^{17}$ (5E17) cm$^{-3}$. Each body zone 115 forms a second pn junction pn2 with the drift zone 120.

First semiconductor mesas 160 adjoining to at least one active electrode structure 150 further include source zones 110 forming first pn junctions pn1 with the body zone 115. Second semiconductor mesas 160 between passive electrode structures 180 may be devoid of any source zones 110.

The source zones 110 may be formed as wells extending from the first surface 101 into the body zone 115 and define transistor cells TC arranged at a first distance d1 along the longitudinal axis of the respective semiconductor mesa 160. Shadowed regions 165 without source zones 110 separate neighboring transistor cells TC assigned to the same semiconductor mesa 160, wherein in the shadowed regions 165 the body zone 115 of the semiconductor mesa 160 directly adjoins the first surface 101. Transistor cells TC and shadowed regions 165 alternate along the longitudinal axis of the respective semiconductor mesa 160.

The first distance d1 between neighboring source zones 110 arranged along the second lateral direction may be in a range from 1 μm to 200 μm, for example in a range from 3 μm to 100 μm.

A dielectric structure 220 separates a first load electrode 310 from the first surface 101. The dielectric structure 220 may include one or more dielectric layers from silicon oxide, silicon nitride, silicon oxynitride, doped or undoped silicon glass, for example BSC (boron silicate glass), PSG (phosphorus silicate glass), or BPSG (boron phosphorus silicate glass), by way of example.

The first load electrode 310 may be an IGBT emitter electrode or may be electrically coupled or connected to a first load terminal L1 which may be the IGBT emitter terminal of the semiconductor device 500.

Contact structures 315 extend through the dielectric structure 220 and may extend into the semiconductor body 100. The contact structures 315 electrically connect the first load electrode 310 with the source zones 110 and the body zones 115. A plurality of spatially separated contact structures 315 may directly adjoin the respective semiconductor mesa 160, wherein at least some of the contact structures 315 may be assigned to the source zones 110. Other embodiments may provide stripe-shaped contact structures 315 that extend along the whole longitudinal extension of the respective semiconductor mesa 160 and directly adjoin the shadowed regions 165.

A second load electrode 320 directly adjoins the second surface 102 and the pedestal layer 130. The second load electrode 320 may be or may be electrically connected to a second load terminal L2, which may be the IGBT collector terminal.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

In a separation region 400 between neighboring source zones 110 arranged along the extension direction the capacitive coupling between the semiconductor mesa 160 and the gate electrode 155 is lower than outside of the separation region 400. Alternatively or in addition, the lateral conductivity of majority charge carriers of the drift zone 120, i.e., electrons for n-channel RC-IGBTs is lower in the separation region 400 than outside of the separation region 400.

In the following, the effect of the separation region 400 is described by reference to an n-channel RC-IGBT with n-type source and drift zones 110, 120 and p-type body zones 115. The same considerations analogously apply to p-channel RC-IGBTs.

In an on-state of the semiconductor device 500 a voltage applied to the gate electrodes 155 exceeds a threshold voltage at which an n-type inversion layer is formed through the body zones 115. For a voltage $V_{CE}$ applied between first and second load electrodes 310, 320 exceeding the built-in voltage of the third pn junctions pn3 between the drift zone 120 or the field stop layer 128 and the p-type first zones 131 of the pedestal layer 130, the resulting electron flow between the first and second load electrodes 310, 320 forward biases the third pn junctions pn3, wherein holes are injected into the drift zone 120. The resulting high-density charge carrier plasma in the drift zone 120 results in a low collector-to-emitter saturation voltage $V_{CE,sat}$ and in low on-state losses.

In the RC (reverse conduction) mode a positive gate voltage, e.g. +15V, may be applied to the gate terminal G such that an inversion layer is formed in the body zone 115 along the gate electrode structures 150 and electrons may flow from the second load electrode 320 through the drift zone 120 and the inversion layer to the first load electrode 310. With increasing reverse current a lateral voltage drop at the second pn junction pn2 towards the transistor cell TC increases such that the body zone 115 starts injecting holes into the drift zone 120 and a charge carrier plasma builds up that increases the conductivity of the drift zone 120 to a degree that starting at a snapback voltage $V_{SB}$ the negative collector-to-emitter voltage $V_{CE}$ becomes less negative with further increasing collector current $I_C$.

By reducing the lateral conductivity along the second pn junction pn2 at least for positive gate voltages, the lateral voltage drop increases faster such that the respective body zone 115 starts to inject at a lower current level. As a result, the RC-IGBT exhibits a significantly reduced snapback voltage at a positive gate voltage $V_G$.

The electron conductivity may be reduced permanently by providing suitable low-conductive structures projecting into the semiconductor mesa. Alternatively or in addition the electron conductivity may be reduced temporarily, e.g. in a mode providing a positive gate voltage of 15V, by reducing a capacitive coupling between the semiconductor mesa 160 and the gate electrode 155. A reduced capacitive coupling lowers the lateral conductivity for electrons in the RC mode at positive gate voltages, e.g., at a gate voltage of 15V.

For example, a distance between the gate electrode 155 and the semiconductor mesa 160 may be increased, e.g., by locally omitting the gate electrode 155, or by locally increasing the thickness of the gate dielectric 151 within the separation region 400. According to other embodiments, one or more separation structures having a lower conductivity for charge carriers than the body zone 115 replace portions of the semiconductor mesas 160 in the shadowed regions 165. The embodiments illustrated in the following figures are based on the semiconductor device 500 of FIGS. 1A to 1D and the description of the following embodiments refers to and includes the description of FIGS. 1A to 1D.

Figure 2A:
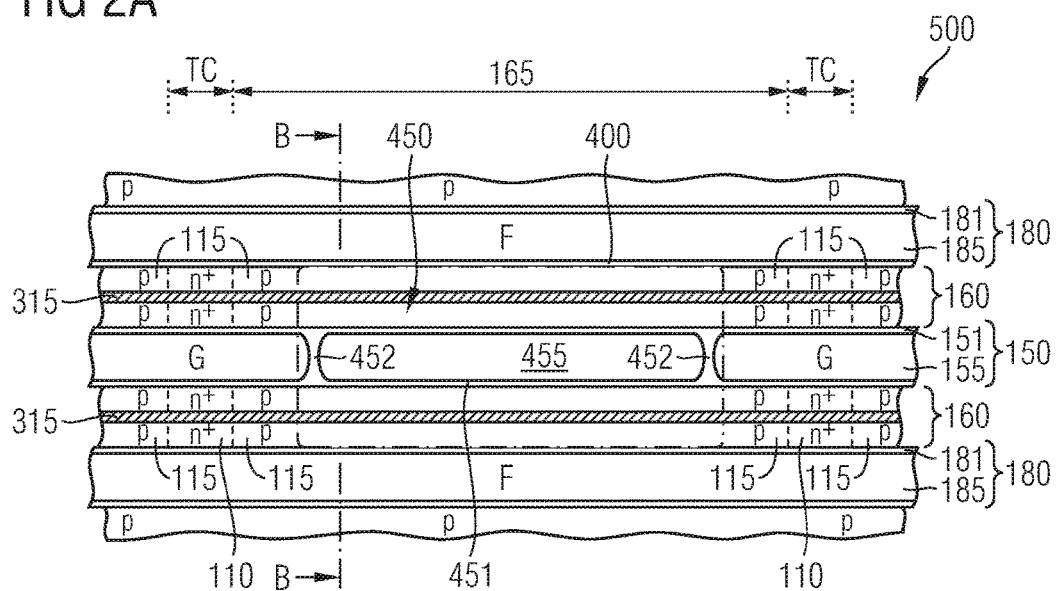
FIG. 2A is a schematic lateral cross-sectional view of a portion of a semiconductor device in accordance with an embodiment including a separation region with inactive electrode portions along body zones between neighboring source zones.
Figure 2B:
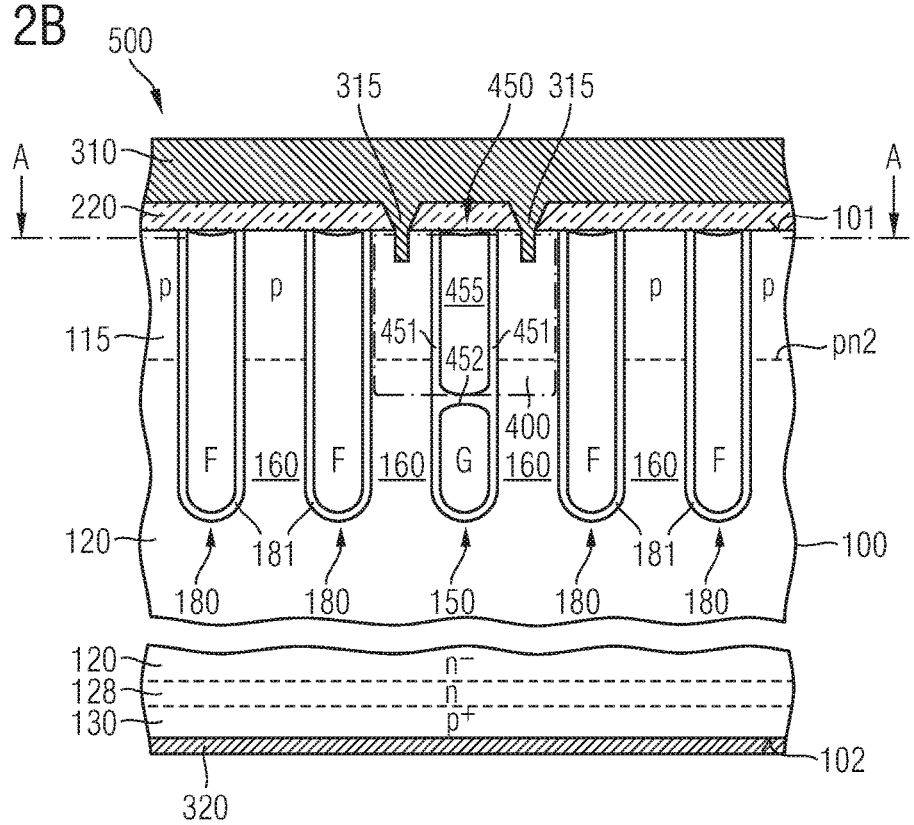
FIG. 2B is a schematic cross-sectional view of the semiconductor device portion of FIG. 2A along line B-B.

In the separation regions 400 of the semiconductor device 500 of FIGS. 2A and 2B auxiliary structures 450 replace at least upper portions of the active electrode structures 150 between the first surface 101 and the second pn junction pn2. The auxiliary structures 450 may include an auxiliary dielectric 451, which may have the same composition and configuration as the gate dielectric 151, a fill portion 455, which may be a dielectric material, an intrinsic semiconductor material or a conductive material, as well as a dielectric separation 452 separating the fill portion 455 and the gate electrode 155. Auxiliary dielectric 451 and/or dielectric separation 452 may be omitted for dielectric fill portions 455. A conductive fill portion 455 may float or may be electrically connected to one of the load electrodes 310, 320 or to an auxiliary terminal. The fill portion 455 may consist of or include a conductive material with higher heat conductivity and/or heat capacity than silicon oxide, e.g., copper or a conductive phase change material, or a dielectric sub-layer directly adjoining the semiconductor mesa 160 and a void filled with trapped ambient air.

The auxiliary structure 450 may have a smaller vertical extension than the active electrode structure 150 such that the gate electrode 155 includes a contiguous portion along the second lateral direction over the total length of the adjoining semiconductor mesas 160.

Without gate electrode 155 no inversion layer is formed in the shadowed region 165 at positive gate voltages such that in the shadowed regions 165 the total conductivity for electrons in the semiconductor mesas 160 is reduced.

Figure 2C:
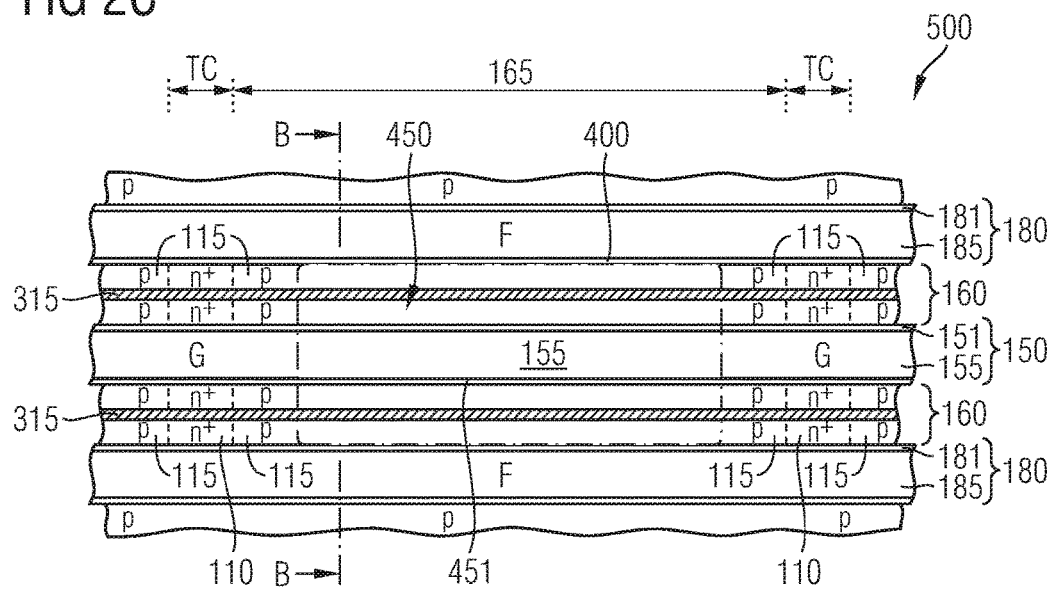
FIG. 2C is a schematic lateral cross-sectional view of a portion of a semiconductor device in accordance with an embodiment including a separation region with inactive electrode portions along drift zone sections between neighboring source zones.
Figure 2D:
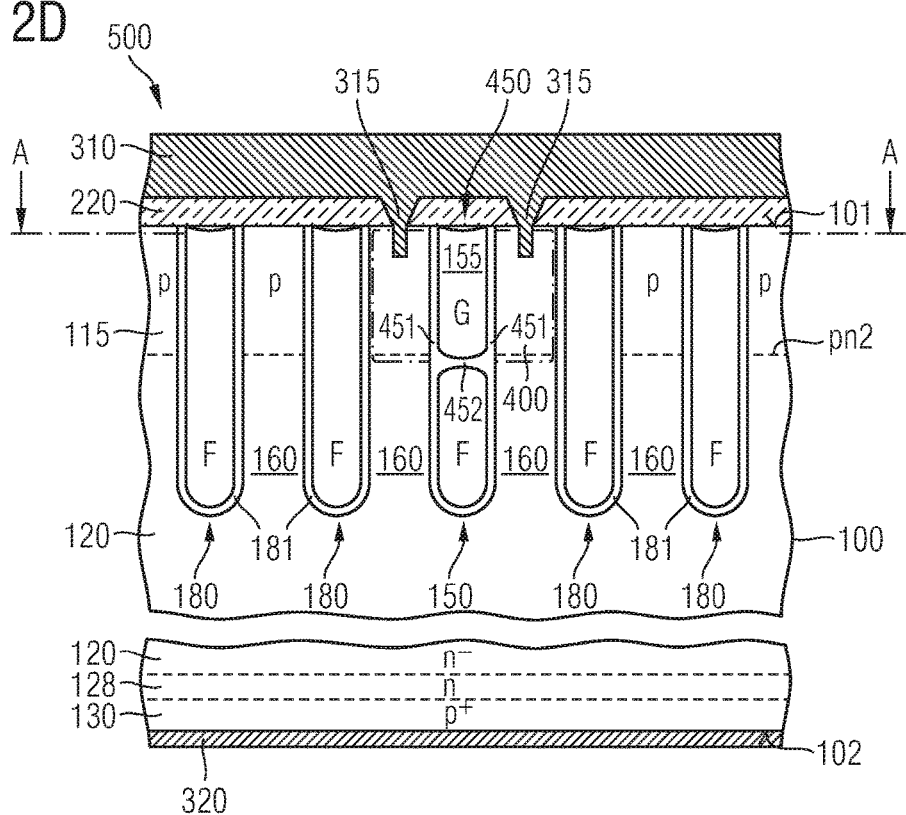
FIG. 2D is a schematic cross-sectional view of the semiconductor device portion of FIG. 2C along line B-B.

In the separation regions 400 of the semiconductor device 500 of FIGS. 2C and 2D auxiliary structures 450 replace only lower portions of the active electrode structures 150 between the second pn junction pn2 and the buried edge of the active electrode structures 150. With regard to further details of the auxiliary structures 450, reference is made to the embodiment of FIGS. 2A and 2B.

Without gate electrode 155 no accumulation layer is formed in the drift zone 120 in the shadowed regions 165 at positive gate voltages such that in the shadowed regions 165 the total conductivity for electrons is reduced.

Figure 3A:
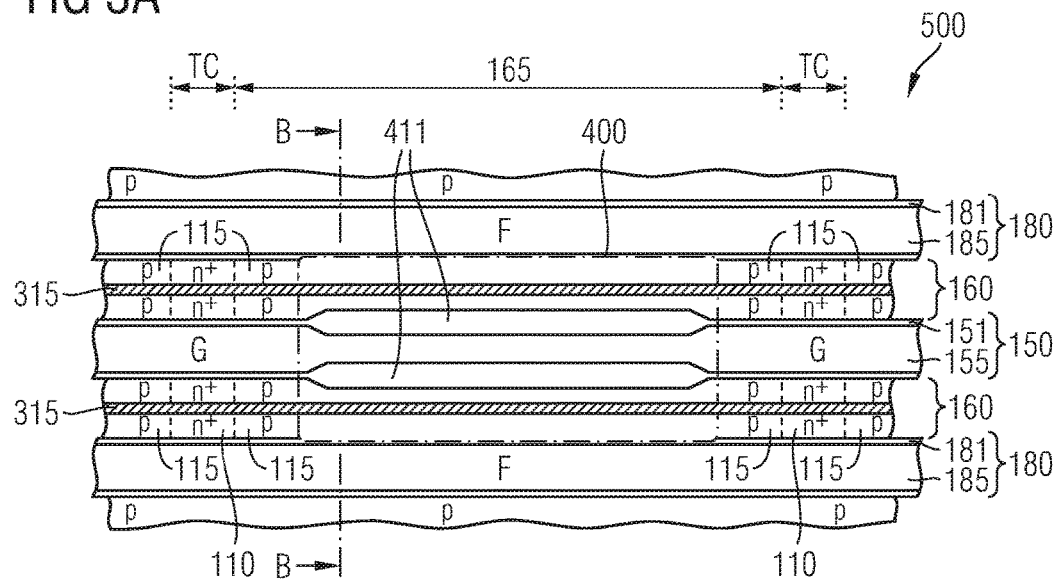
FIG. 3A is a schematic lateral cross-sectional view of a portion of a semiconductor device in accordance with an embodiment including a separation region with electrode portions with increased dielectric width.
Figure 3B:
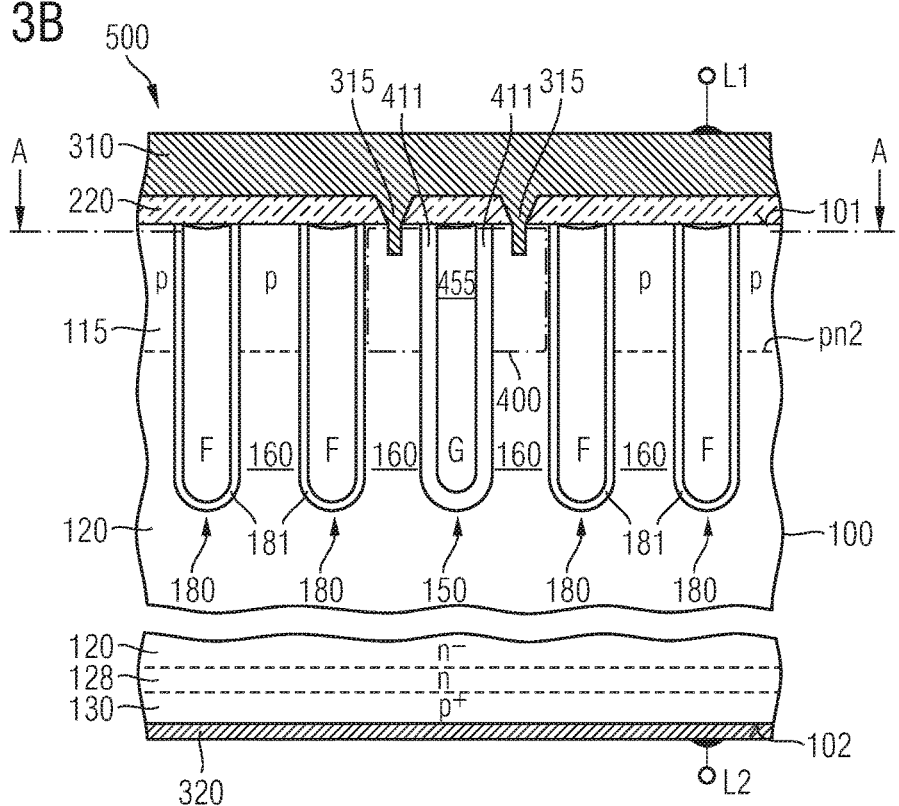
FIG. 3B is a schematic cross-sectional view of the semiconductor device portion of FIG. 3A along line B-B.

In the semiconductor device 500 of FIGS. 3A to 3B an ancillary dielectric 411 replaces the gate dielectric 151 in the separation region 400. The ancillary dielectric 411 may be thicker than the gate dielectric 151 and/or may be formed from a material with a lower static permittivity than the material of the gate dielectric 151 such that no accumulation layer or a weaker accumulation layer than outside the separation region 400 is formed in the drift zone 120 and no inversion layer or a weaker inversion layer than outside the separation region 400 is formed in the body zone 115.

Figure 4:
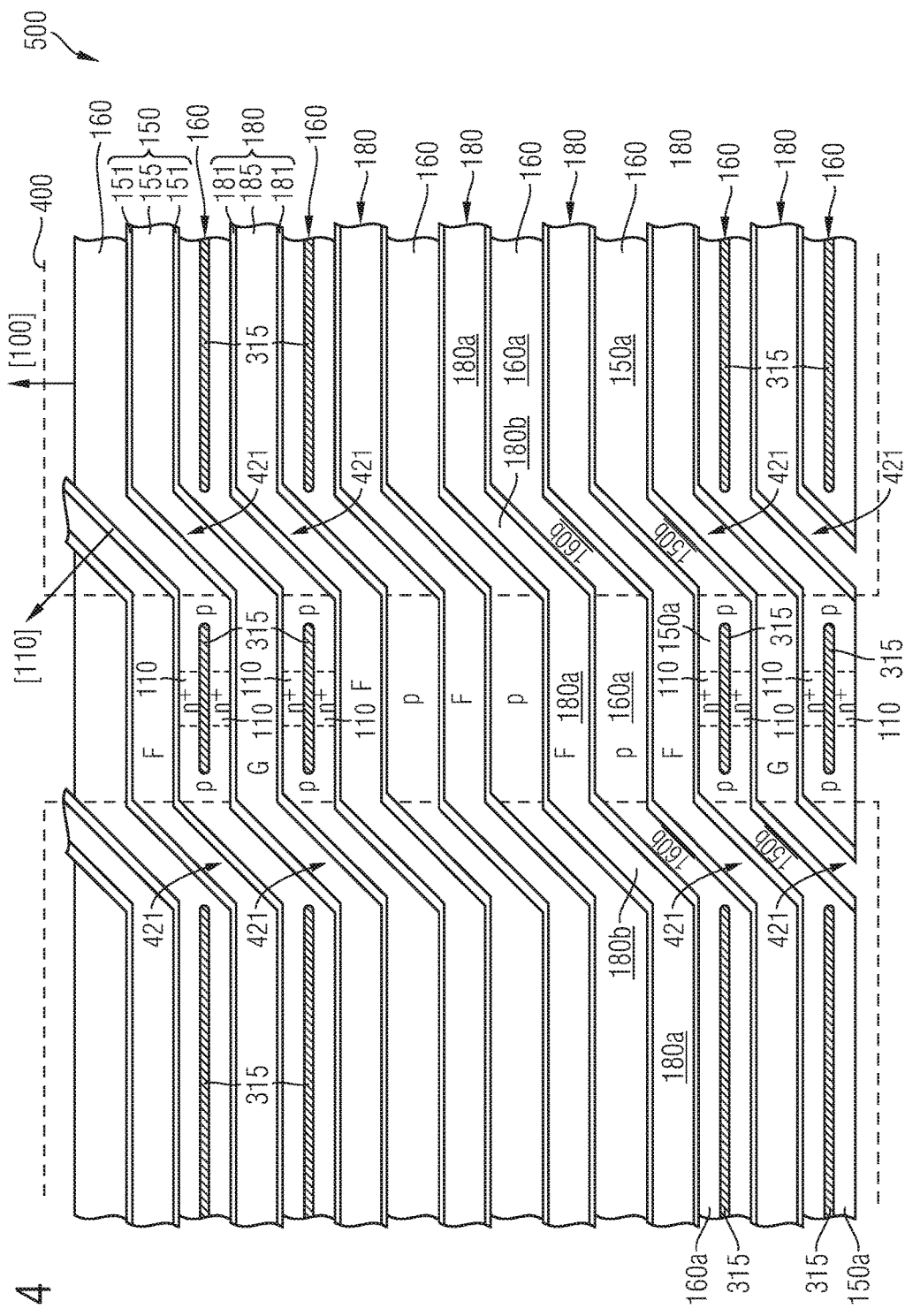
FIG. 4 is a schematic lateral cross-sectional view of a portion of an RC-IGBT in accordance with an embodiment including separation regions based on the slanted portions of semiconductor mesas with straight and slanted portions.

The semiconductor device 500 of FIG. 4 is an RC-IGBT with the semiconductor mesas 160 and the electrode structures 150, 180 including straight portions 160a, 150a, 180a parallel to the first lateral direction and slanted portions 160b, 150b, 180b extending along a direction intersecting the first lateral direction and connecting the straight portions 160a, 150a, 180a. The slanted portions 160b, 150b, 180b may form the separation regions 400.

Sidewalls of the straight portions 160a, 150a, 180a may be [100] crystal planes and sidewalls of the slanted portions 160b, 150b, 180b may be [110] crystal planes. The carrier mobility in [110] crystal planes of the slanted portions 160b of the semiconductor mesas 160 and/or higher oxide growth rate on [110] crystal planes than on [100] crystal planes may result in a lower lateral conductivity for electrons in the separation region 400. The higher oxide growth rates may form the ancillary dielectrics as described in FIG. 3A without further patterning processes. For selected embodiments, this may further lead to a closing of the semiconductor mesas 160 by through-oxidation of the slanted portions 160b.

In addition, in the separation region 400 contact structures 315 formed in a lateral projection along a second lateral direction parallel to the straight mesa portions 160a may contact semiconductor mesas 160, which are devoid of active transistor cells TC. Hence, the slanted mesa portions 160b may in effect isolate contact structures 315 in active semiconductor mesas 160 with source zones 110 from contact structures 315 in passive semiconductor mesas 160 without source zones 110 in the second lateral direction. In the RC-mode no or only weak inversion channels connect the active semiconductor mesas 160 to the source zones 110.

Figure 5A:
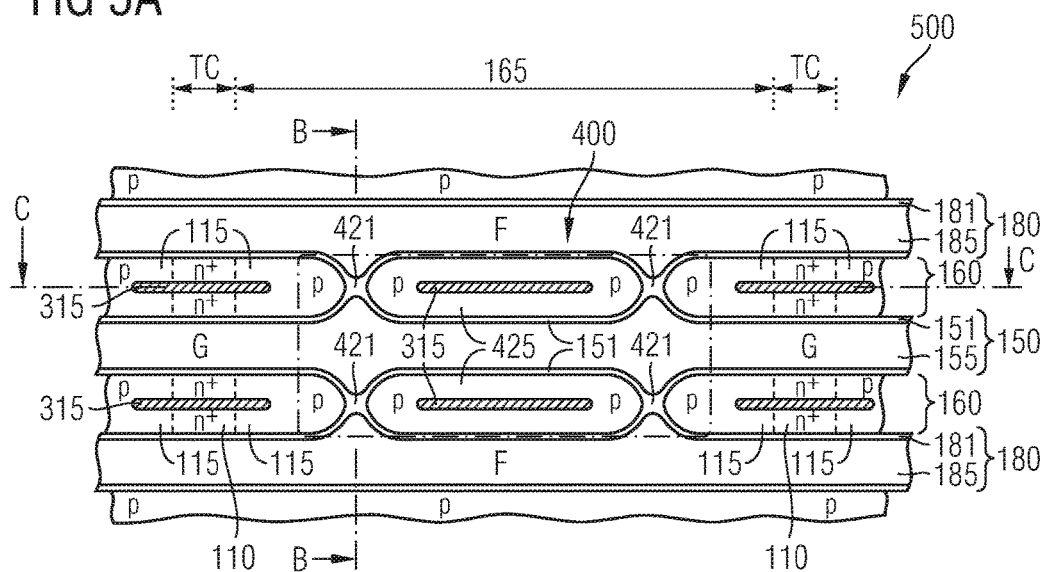
FIG. 5A is a schematic lateral cross-sectional view of a portion of a semiconductor device with dielectric separation structures between neighboring source zones in accordance with a further embodiment related to RC-IGBTs.
Figure 5B:
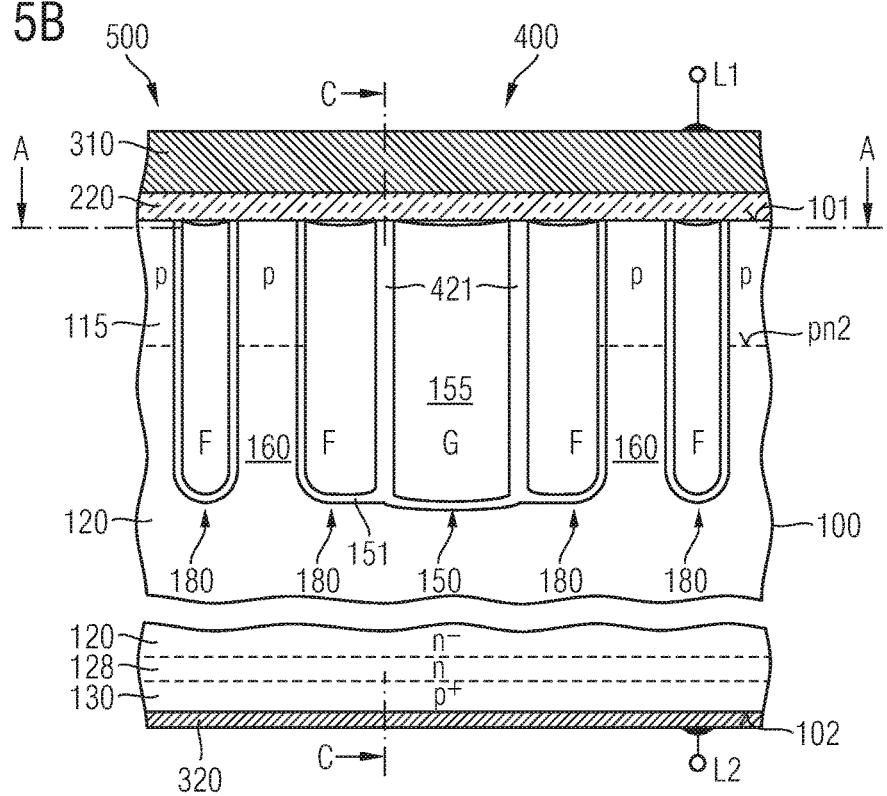
FIG. 5B is a schematic cross-sectional view of the semiconductor device portion of FIG. 5A along line B-B.

FIGS. 5A to 5B refer to embodiments of a semiconductor device 500 with separation regions 400 that include at least one dielectric separation structure 421, respectively. The dielectric separation structure 421 may exclusively include dielectric materials or may include conductive materials as well as dielectric materials separating the conductive materials from the surrounding semiconductor material or may include a void filled with a fluid, for example, trapped air.

The separation structure 421 may be a homogeneous structure of one single dielectric material or may be a layer structure including two or more sub-layers of different materials. For example, the separation structure 421 is formed from silicon oxide. According to an embodiment the separation structure 421 consists of or includes a dielectric material with higher heat conductivity and/or heat capacity than silicon oxide, e.g., diamond or a dielectric phase change material. According to another embodiment the separation structure 421 includes a dielectric sub-layer directly adjoining the semiconductor mesa 160 as well as a conductive material with higher heat conductivity and/or heat capacity than silicon oxide, e.g., copper or a conductive phase change material, or a dielectric sub-layer directly adjoining the semiconductor mesa 160 and a void filled with trapped ambient air.

According to an embodiment each separation region 400 includes one single separation structure 421 symmetrically arranged with regard to a vertical plane at the half distance between neighboring source zones 110 assigned to the same semiconductor mesa 160. The separation structure 421 may extend over at least 100 nm of the distance between the two concerned source zones 110. A distance between the source zones 110 and the respective separation structure 421 may be at least 1 µm or at least 10 µm.

The illustrated semiconductor device 500 refers to an embodiment with at least two separation structures 421 per separation region 400. The at least two separation structures 421 may be symmetric with respect to a vertical plane at the half distance between the concerned source zones 110. An auxiliary mesa 425 separates the separation structures 421. The heat conductivity of the auxiliary mesa 425 may be better than the heat conductivity of the separation structures 421 and may increase robustness against short-circuit-induced thermal destruction. In addition, the auxiliary mesa 425 may keep mechanical stress low that may result from different coefficients of temperature expansion for the separation structures 421 and the semiconductor body 100.

The separation structures 421 may directly adjoin the neighboring source zones 110. According to the illustrated embodiment, a distance between the separation structure 421 and the source zone 110 is set such that the presence of the separation structure 421 does not affect the threshold voltage of the semiconductor device 500. In addition, below a design-specific minimum distance a relative increase of the carrier density in and around the transistor cell TC is less than a relative increase of a current density induced by the separation structure 421 such that a voltage drop in the semiconductor mesa 160 may adversely increase $V_{CE,sat}$. According to the illustrated embodiment, a distance between the separation structure 421 and the source zone 110 is at least half of the mesa width of the semiconductor mesa 150, for example at least the mesa width.

The separation structures 421 may extend from the first surface 101 to at least the second pn junction pn2. According to the illustrated embodiment, the vertical extension of the separation structures 421 is greater than the vertical extension of the electrode structures 150, 180. A maximum value of the electric-field strength is pulled away from the buried edges of the electrode structures 150, 180 and the gate and field dielectrics 151, 181. As a result the gate and field dielectrics 151, 181 are subjected to lower maximum electric field peaks. Field-induced degradation of the gate and field dielectrics 151, 181 is reduced and long-term stability of the semiconductor device 150 is increased.

Figure 6:
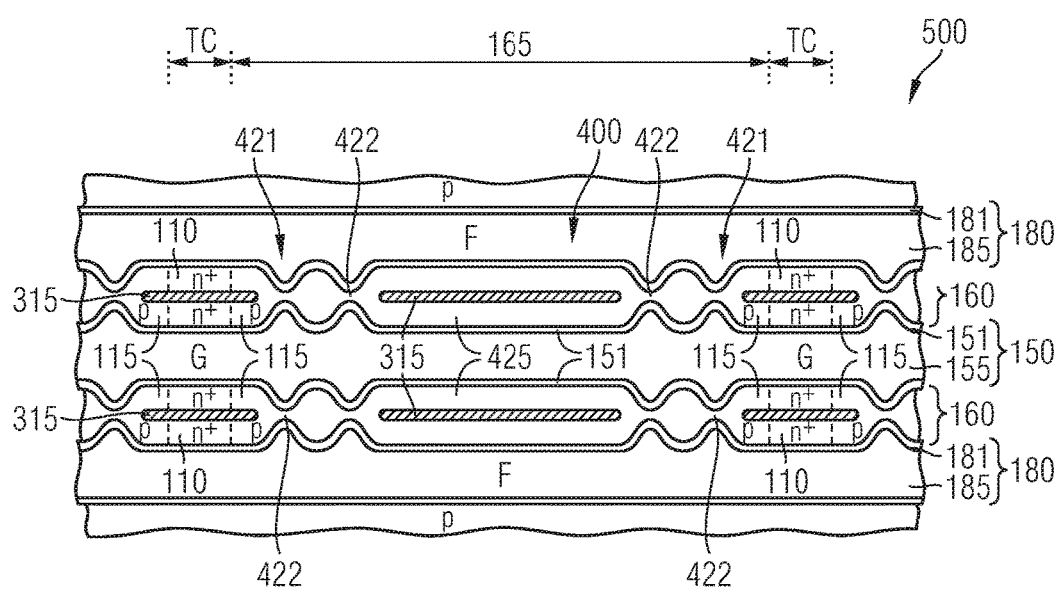
FIG. 6 is a schematic lateral cross-sectional view of a portion of a semiconductor device according to an embodiment related to separation structures including semiconducting connecting portions.

The semiconductor device of FIG. 6 includes separation structures 421 resulting from an oxidation of the material of the semiconductor mesas 160, wherein before oxidation precursor semiconductor mesas are provided with constrictions sufficiently wide, such that the constrictions are not completely oxidized and a remaining semiconducting connecting portion 422 connects the portions of the semiconductor mesas 160 adjoining the respective separation structure 421 on opposite sides.

The semiconductor and auxiliary mesas 160, 425 may taper with decreasing distance to the separation structures 421, respectively. In a silicon semiconductor body 100 the tapered portions may have [110] crystal planes and the straight portions [100] crystal planes. Portions of the gate dielectric 151 on the tapered portions of the semiconductor and auxiliary mesas 160, 425 may be thicker than on the straight portions.

Figure 7:
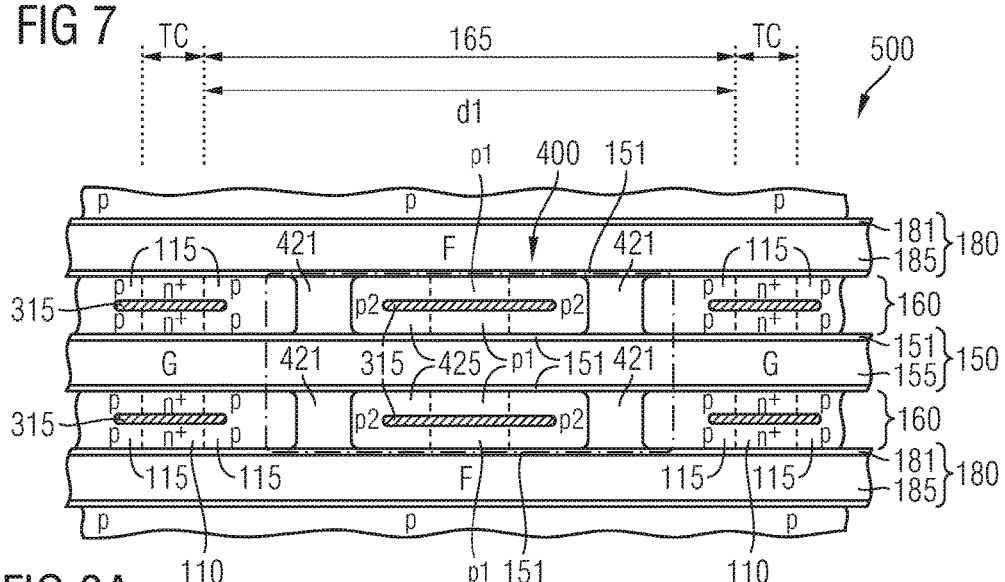
FIG. 7 is a schematic lateral cross-sectional view of a portion of a semiconductor device according to an embodiment related to a lateral variation of doping in auxiliary mesas in the separation region.

FIG. 7 refers to an embodiment with two separation structures 421 and a lateral variation of doping in the auxiliary mesa 425. The separation structures 421 may be equally spaced. An impurity concentration p2 close to the transistor cells TC is higher than an impurity concentration p1 in the center of the shadowed region 165, wherein the impurity concentration p1 is lower than the doping in the body zones 115 of the transistor cells TC. The impurity concentration p2 may be higher, lower or equal to the doping in the body zones 115 of the transistor cells TC.

Figure 8A:
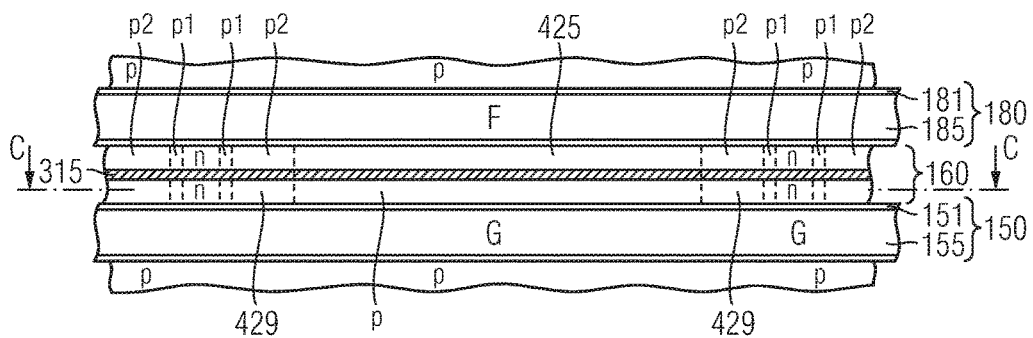
FIG. 8A is a schematic lateral cross-sectional view of a portion of a semiconductor device according to a further embodiment related to a lateral variation of doping close to transistor cells.
Figure 8B:
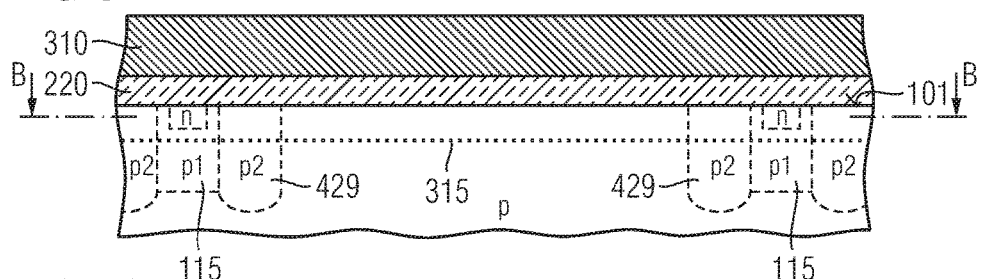
FIG. 8B is a schematic cross-sectional view of the semiconductor device portion of FIG. 8B along line C-C.
Figure 8C:
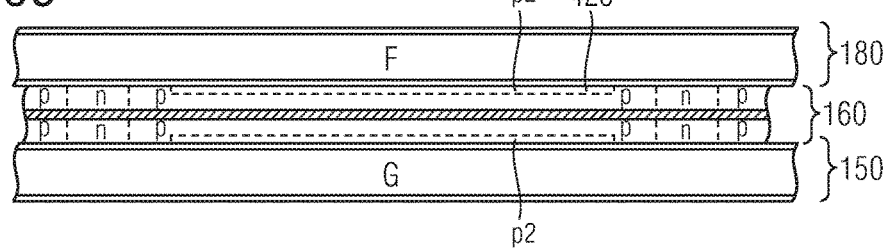
FIG. 8C is a schematic cross-sectional view of a portion of a semiconductor device according to an embodiment related to a lateral variation of doping using PLAD (Plasma Doping).

FIGS. 8A to 8C refer to embodiments reducing the lateral conductivity for majority charge carriers of the drift zone 120 by a variation of doping in the semiconductor mesa 160.

In FIGS. 8A and 8B a lateral variation of doping in portions of the semiconductor mesas 160 close to the transistor cells TC reduces the electron conductivity. The separation region 400 includes doped regions 429 of the conductivity type of the body zones 115, wherein the doped regions 429 directly adjoin the body zones 115 along the extension direction of the respective semiconductor mesa 160. The impurity concentration p2 in the doped regions 429 is higher than in the body zones 115. The doped regions 429 reduce the conductivity of a lateral channel. The penetration depth of the doped regions 429 may be deeper than the penetration depth of the body zones 115 to further increase the lateral voltage drop In addition or alternatively the p-doping along at least the active electrode structures 150 may be increased, e.g., by PLAD as illustrated in FIG. 8C. When doping with PLAD, the semiconductor body 100 is exposed to a plasma including ions of dopants at a processing stage with sidewalls of the semiconductor mesas 160 exposed or covered by a thin dielectric. An electric field accelerates the ions towards the substrate and implants the ions into the sidewalls of the semiconductor mesas 160. A penetration depth of the dopants and the implant dose may be adjusted via a pulsed DC voltage applied between the semiconductor body 100 and a shield ring surrounding a substrate including the semiconductor body.

Figure 9A:
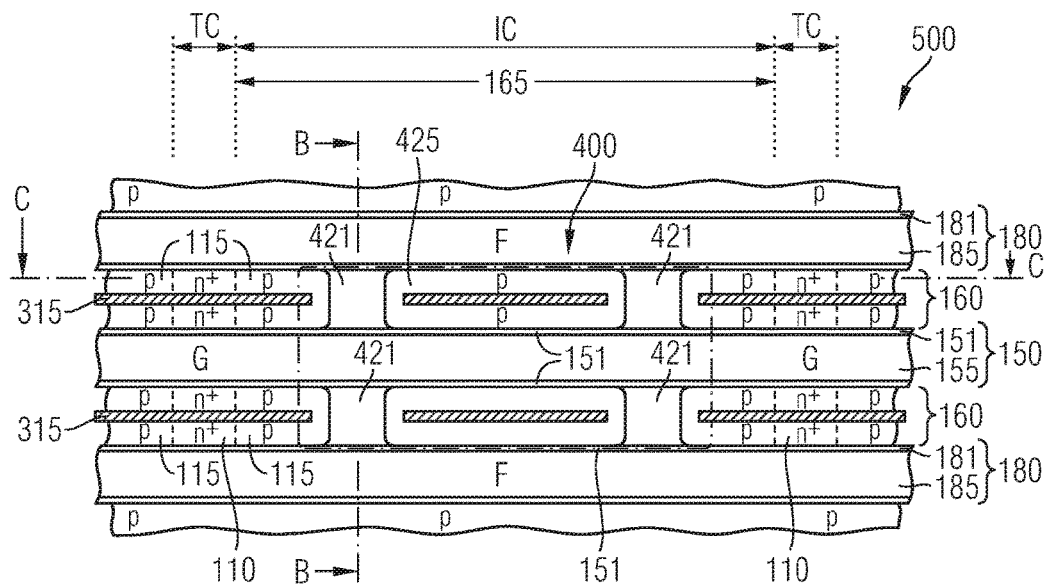
FIG. 9A is a schematic lateral cross-sectional view of a portion of a semiconductor device with dielectric separation structures between neighboring source zones in accordance with a further embodiment related to RC-IGBTs.
Figure 9B:
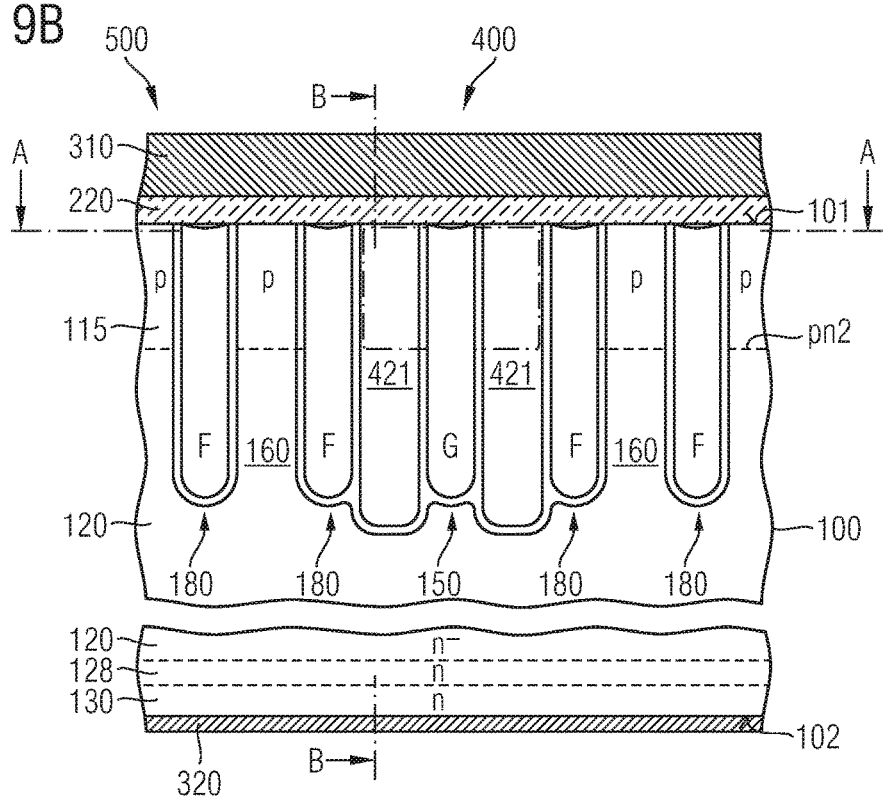
FIG. 9B is a schematic cross-sectional view of the semiconductor device portion of FIG. 9A along line B-B.
Figure 9C:
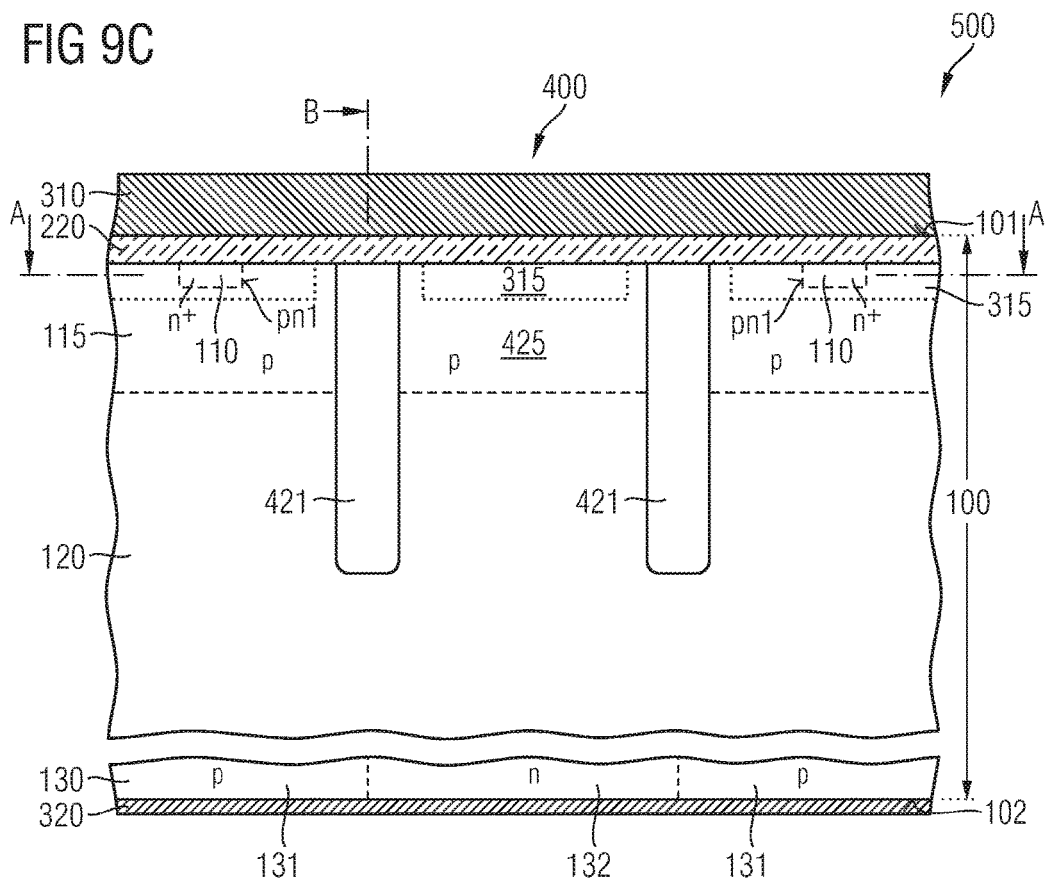
FIG. 9C is a schematic cross-sectional view of the semiconductor device portion of FIG. 9A along line C-C.
Figure 9D:
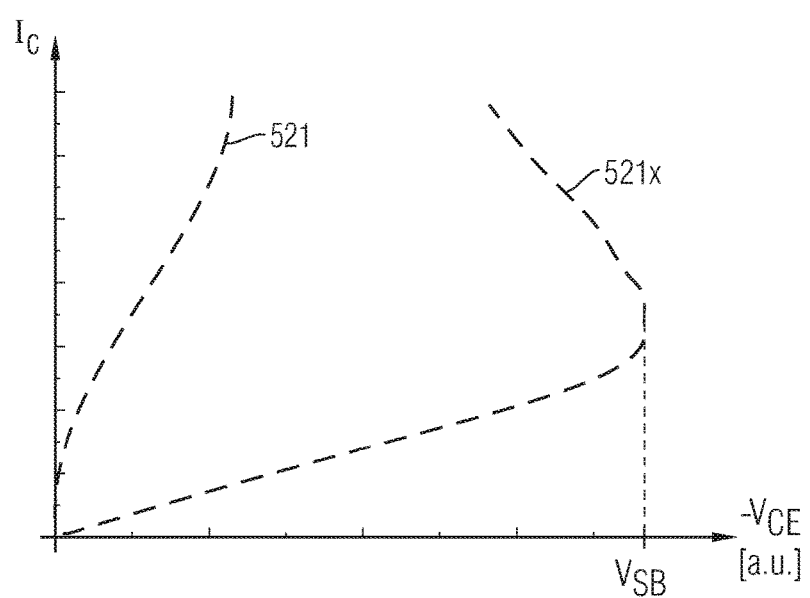
FIG. 9D is a diagram for schematically illustrating an RC characteristic of the semiconductor device of FIGS. 9A to 9C.

The semiconductor device 500 in FIGS. 9A to 9C is an RC-IGBT with dielectric separation structures 421 similar to the dielectric separation structures 421 of FIGS. 5A to 5B. FIG. 9D illustrates the effect of the dielectric separation structures 421 on the RC (reverse conducting) characteristic.

The pedestal layer 130 includes first zones 131 of the conductivity type in the body zones 115 and second zones 132 of the conductivity type in the drift zone 120. Each first and second zone 131, 132 extends from the field stop zone 128 or, in absence of the field stop zone 128, from the drift zone 120 to the second surface 102. The impurity concentrations in the first and second zones 131, 132 are sufficiently high to form ohmic contacts with the second load electrode 320, respectively.

The contact structures 315 directly adjoin to both the source zones 110 and the auxiliary mesas 425. The contact structures 315 may be contiguous stripes extending over the total length of the electrode structures 150, 180 or may be absent in the vertical projection of the dielectric separation structures 421. The shadowed regions 165 are effective as injection cells IC during the RC mode.

In FIG. 9D the RC characteristic 521x refers to a comparative RC-IGBT without separation structures 421 at a gate voltage of 15V. After switching into the RC mode, electrons flowing from the second load electrode 320 to the first load electrode 310 generate a voltage drop across the second pn junction pn2, which dominates the collector-to-emitter voltage $V_{CE}$ and which increases with increasing collector current $I_C$. Where in the injection cell IC the lateral voltage drop towards the transistor cell TC at the second pn junction pn2 is sufficiently high, the body zone 115 starts injecting holes into the drift zone 120. When the increasingly negative collector-to-emitter voltage $V_{CE}$ reaches a negative snapback voltage $V_{SB}$ the hole emitter efficiency abruptly increases such that a charge carrier plasma formed by the injected holes in combination with the electrons injected through the second zones 130b increases the conductivity of the drift zone 120 to a degree that starting from the snapback voltage $V_{SB}$ the negative collector-to-emitter voltage $V_{CE}$ becomes less negative with further increasing collector current $I_C$. A high absolute value of the snapback voltage leads to an instable performance and may promote undesired current filamentation.

By reducing the lateral conductivity along the second pn junction pn2 and/or by geometrically increasing the length of the electron path towards the transistor cells TC, the lateral voltage drop increases faster such that the injection cell IC starts to inject at a lower current level. As a result, the RC-IGBT according to FIGS. 9A to 9C exhibits a significantly reduced absolute value of the snapback voltage at a gate voltage $V_G$ of 15V as indicated by RC characteristic 521 in FIG. 9D.

Alternatively or in addition to providing the separation structures 421, the lateral conductivity for electrons may be reduced by suppressing or attenuating an electron accumulation layer in the injection cell IC caused by a positive gate voltage as described above for FIGS. 2A to 3B.

Improving the RC characteristic for positive gate voltages, for example for gate voltages above a threshold voltage at which the RC-IGBT switches from the off state IGBT mode to the on state IGBT mode, facilitates the use of the RC-IGBT in combination with low-cost IGBT gate drivers. Some low-cost IGBT gate drivers do not necessarily apply a 0V or −15V gate voltage in the RC mode at all. Other IGBT gate drivers relying on an $I_C$ measurement for detecting the RC mode may apply a gate voltage above the threshold voltage, e.g., 15V as long as the detected $I_C$ is below a certain threshold current in order to ensure a safe on state IGBT mode operation even for low collector currents $I_C$.

Figure 10:
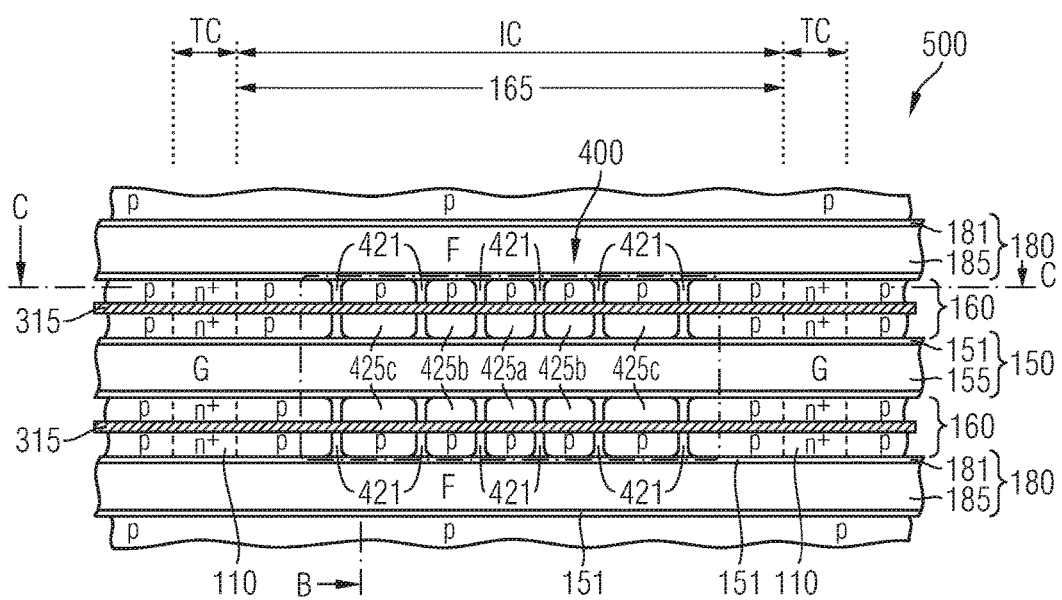
FIG. 10 is a schematic lateral cross-sectional view of a portion of a semiconductor device with six dielectric separation structures between neighboring source zones in accordance with a further embodiment related to RC-IGBTs.

In FIG. 10 the semiconductor device 500 is an RC-IGBT with a separation region 400 including more than two separation structures 421 and more than one auxiliary mesa 425a, 425b, 425c.

The separation structures 421 may be symmetric with respect to a vertical plane in the center of the respective injection cell IC and may be formed by through-oxidizing constricted portions of precursor semiconductor mesas as described in detail for FIGS. 13A to 13H below. The net impurity concentrations in the auxiliary mesas 425a, 425b, 425c may be equal or may differ from each other. The separation region 400 may include an odd number of separation structures 421 and an even number of auxiliary mesas 425a, 425b, 425c. According to the illustrated embodiment the separation region 400 includes an even number of separation structures 421 and an odd number of auxiliary mesas 425a, 425b, 425c.

With increasing reverse collector current $I_C$ at first the portion of the injection cell IC assigned to the central auxiliary mesa 425a ignites and starts to inject holes into the drift zone 120, wherein the adjoining separation structures 421 limit the maximum hole injection of the auxiliary mesa 425a. The auxiliary mesas 425b neighboring the central auxiliary mesa 425a start to ignite at a higher collector current threshold. In this way, starting from the central auxiliary mesa 425a, the auxiliary mesas 425a, 425b, 425c sequentially start hole injection, wherein the dimensions of the already ignited auxiliary mesas 425a and the intermediate separation structures 421 define the respective ignition collector current.

Multiple separation structures 421 allow adjustment of the dependency of the hole emitter efficiency on the collector current $I_C$ and as a consequence improvement of other device characteristics like surge current capability or turn-off behavior.

Figure 11:
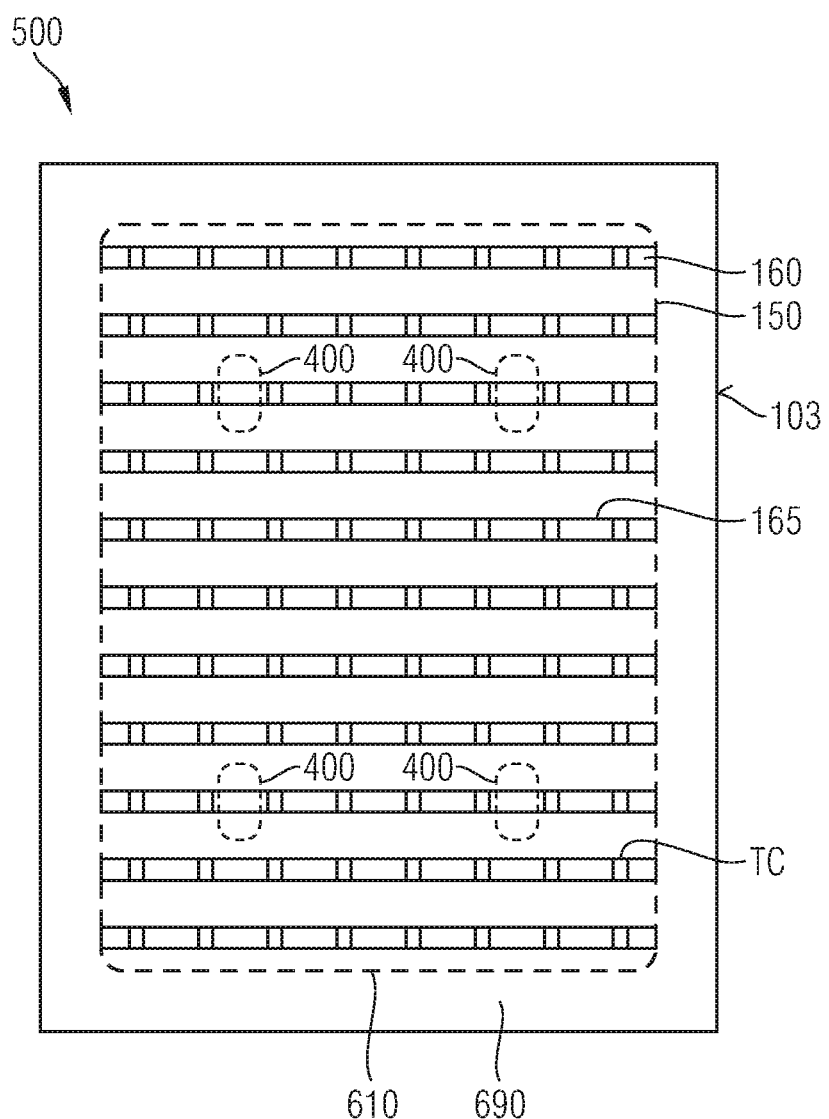
FIG. 11 is a schematic plan view of a semiconductor device according to an embodiment referring to local separation regions.

FIG. 11 shows a schematic plan view for illustrating an arrangement of separation regions 400 in a semiconductor device 500 with stripe-shaped semiconductor mesas 160 and stripe-shapes electrode structures 150 in a cell area 610 surrounded by an edge area 690, which extends along a lateral surface 103 of the semiconductor device 500.

Only in a subset of the shadowed regions 165 of the semiconductor mesas 150 between transistor cells TC separation regions 400 are formed. The separation regions 400 may be evenly distributed over the cell area 610 or may accumulate in a selected portion of the cell area 610. A ratio of shadowed regions with separation regions 400 to the total shadowed regions without separation regions 400 may be in a range from 3% to 60%, e.g. 8% to 20%. A comparatively low number of separation regions 400 may be sufficient to significantly reduce the snap-back effect which typically takes place at low collector currents $I_C$.

Figure 12:
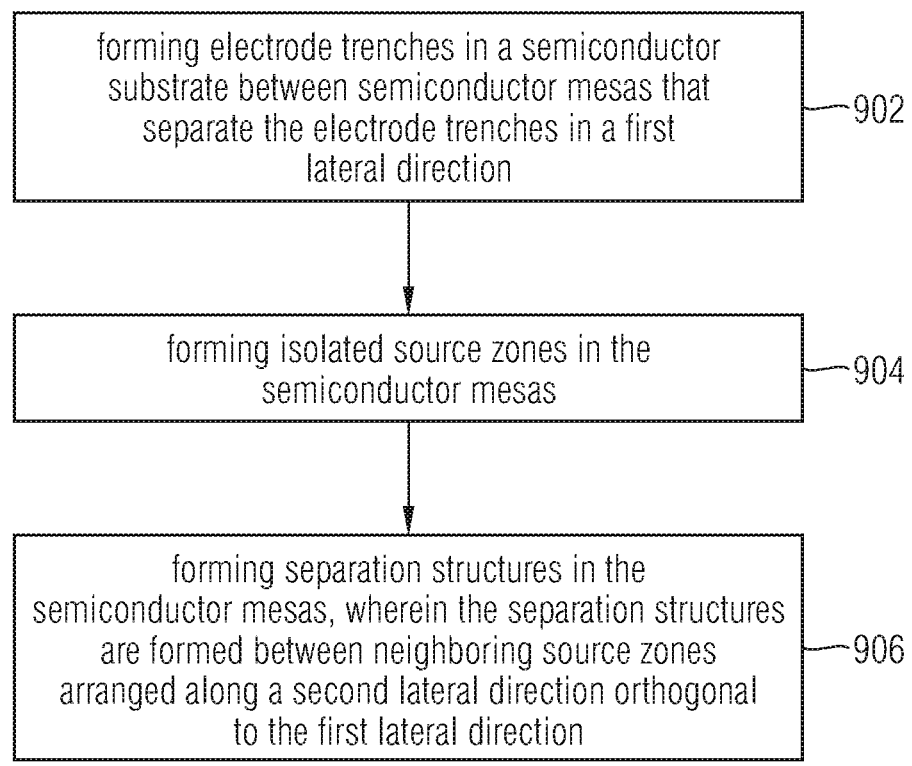
FIG. 12 is a schematic flow chart for illustrating a method of manufacturing a semiconductor device according to a further embodiment.

FIG. 12 refers to a method of manufacturing a semiconductor device, e.g., a semiconductor diode or an IGBT, for example an RC-IGBT or a semiconductor device including IGBT functionality.

In a semiconductor substrate electrode trenches are formed between semiconductor mesas that separate the electrode trenches in a first lateral direction (902). The semiconductor mesas include portions of a drift layer of a first conductivity type and a body layer of a second, complementary conductivity type between a first surface of the semiconductor substrate and the drift layer. In the semiconductor mesas isolated source zones of the first conductivity type are formed (904). The source zones extend from the first surface into the body layer. Separation structures are formed in the semiconductor mesas (906). The separation structures are formed between neighboring source zones which are arranged along a second lateral direction orthogonal to the first lateral direction.

Forming the separation structures may include forming separation trenches in the semiconductor mesas and at least partly filling the separation trenches with a dielectric material to form the separation structures in the separation trenches. For example, a dielectric layer lining the separation trenches may be formed by a deposition process, by thermal oxidation of the semiconductor material of the semiconductor mesas, or by a combination of both. Then a fill material, e.g., a further dielectric material, intrinsic semiconductor material and/or conductive material may be deposited to fill the lined separation trenches. The fill material may be material with high heat capacity and/or heat conductivity. According to other embodiments the lined electrode trenches are only occluded and remain filled with trapped ambient air.

The separation trenches may be formed before, contemporaneously with or after the electrode trenches. The separation trenches may have a greater vertical extension than the body layer. According to an embodiment, the separation trenches may be as deep as or may be deeper than the electrode trenches. The source zones may be formed before or after the forming of the separation structures.

According to another embodiment forming the separation structures may include that during formation of the electrode trenches the semiconductor mesas are formed with constricted portions such that the separation structures can emerge from an oxidation of the material of the semiconductor mesas in the constricted portions, which are completely through-oxidized. In this way, formation of the separation structures may be combined with the formation of the gate dielectric and/or the field dielectric. No additional process is required for the formation of the separation structures such that the separation structures may be implemented by slight modifications of the photolithographic mask for the electrode trench patterning.

FIGS. 13A to 13H show layouts of precursor semiconductor mesas 160a after etching the electrode trenches and before oxidizing constricted portions 169 to form dielectric separation structures. The oxidation may completely through-oxidize the constricted portion 169 or may stop before the constricted portion 169 is completely through-oxidized such that semiconducting connecting portions connect portions of the concerned semiconductor mesa on opposing sides of the constricted portion 169 in the finalized device. Each separation structure may result from one, two or more constricted portions 169. A layout including constrictions allows the formation of separation structures as described above without any additional process step, e.g., an additional lithography process.

The illustrated precursor semiconductor mesas 160a include portions 167 having a mesa width W1 and constricted portions 169 having a constriction width W3. The electrode trenches 150a between neighboring precursor semiconductor mesas 160a have an electrode width W2. The constriction width W3 may be set such that the precursor semiconductor mesa 160a is completely through-oxidized in the constricted portion 169, e.g., during formation of the gate dielectric. According to another embodiment, the constricted portions 169 are not completely through-oxidized such that the resulting semiconductor mesas in the finalized device are only narrowed.

Figure 13A:
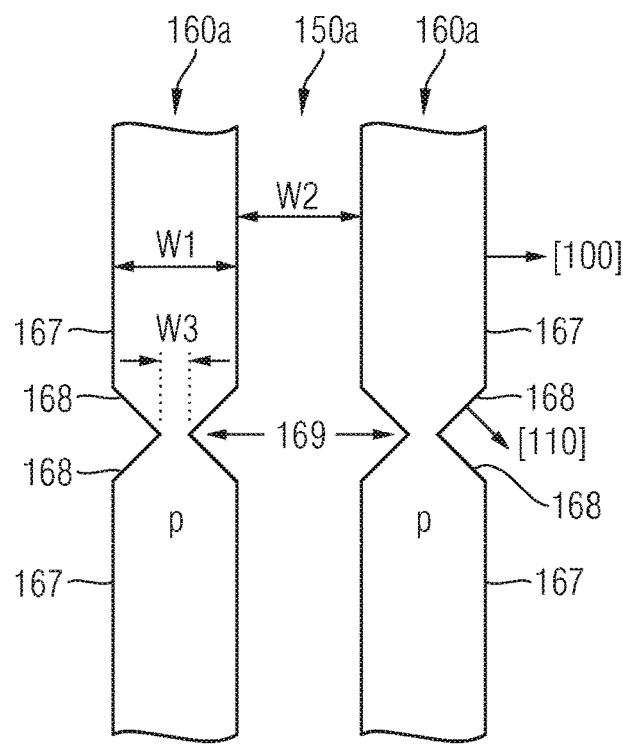
FIG. 13A is a schematic plan view of a layout for precursor semiconductor mesas according to an embodiment providing constricted portions at a contact area of tapering portions.

In FIG. 13A each constricted portion 169 is formed at the contact area of two directly adjoining, mirror-inverted tapering portions 168 of the respective precursor semiconductor mesa 160a. The tapering portions 168 connect the constricted portion 169 with the portions 167 of mesa width W1.

According to an embodiment, the precursor semiconductor mesas 160a are of single-crystalline silicon, sidewalls of the portions 167 of mesa width W1 are [100] crystal planes, and sidewalls of the tapering portions 168 are [110] crystal planes. Since an oxidation rate in the [110] crystal planes is significantly higher than in [100] crystal planes, the constriction width W3 may be set significantly wider than the thickness of the gate dielectric. The precursor semiconductor mesas 160a are mechanically stable during a process phase after etching the electrode trenches 150a and before forming electrode structures in the electrode trenches 150a.

Figure 13B:
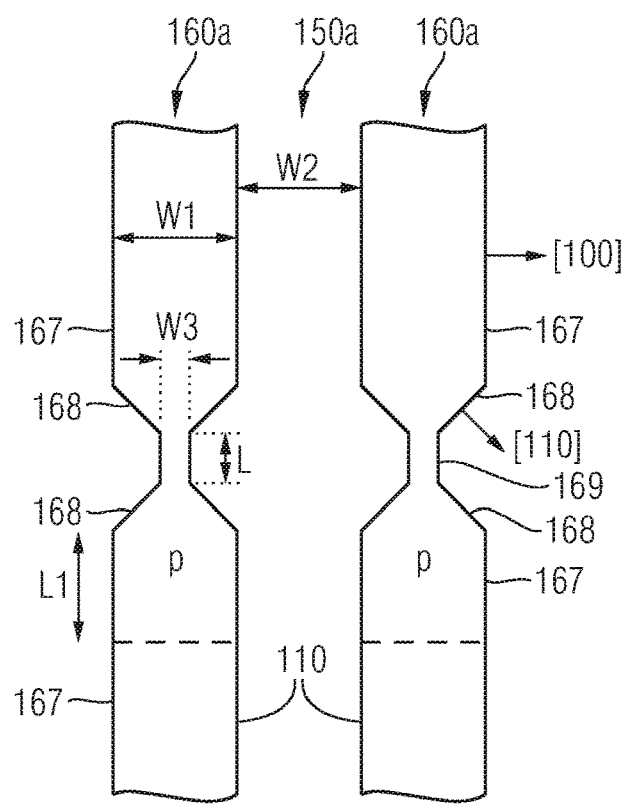
FIG. 13B is a schematic plan view of a layout for precursor semiconductor mesas according to an embodiment providing constricted portions of uniform length between tapering portions.

In FIG. 13B each constricted portion 169 is formed by a narrow portion of constriction width W3 and a length L between two adjoining mirror-inverted tapering portions 168. The constriction width W3 can be well controlled without optical proximity correction features.

The tapering in the tapered portions of FIGS. 13A and 13B is two-sided and may be symmetric with respect to a longitudinal center axis of the respective precursor semiconductor mesa 160a.

Figure 13C:
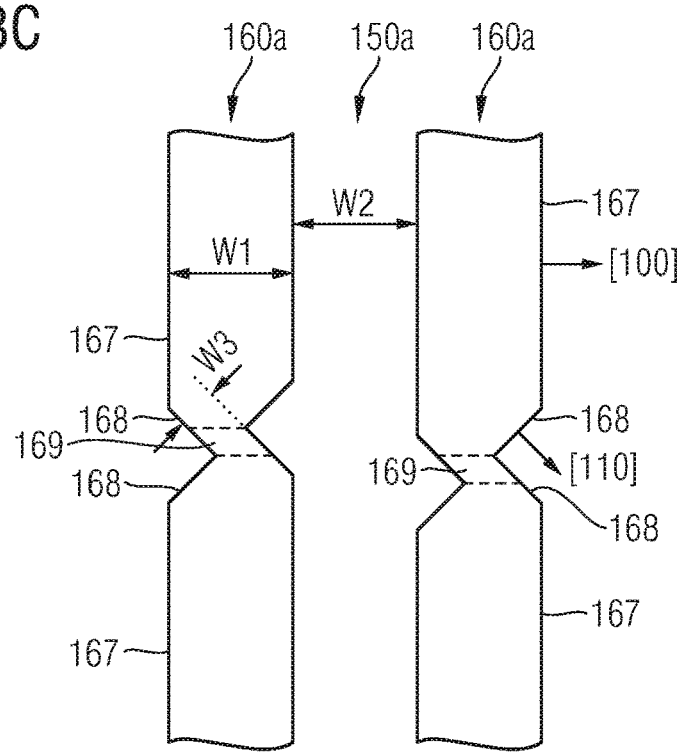
FIG. 13C is a schematic plan view of a layout for precursor semiconductor mesas according to an embodiment providing constricted portions in an overlap region of asymmetric tapering portions.

FIG. 13C refers to precursor semiconductor mesas 160a with two-sided tapering in the tapered portions 168, wherein a tapering on a first side and a tapering on a second, opposite side are shifted to each other along a longitudinal center axis of the precursor semiconductor mesa 160a. An overlapping region of the two tapered portions 168 forms the constricted portion 169. The layout mediates between mesa narrowing and the fill quality for materials filling the electrode trenches 150a.

Figure 13D:
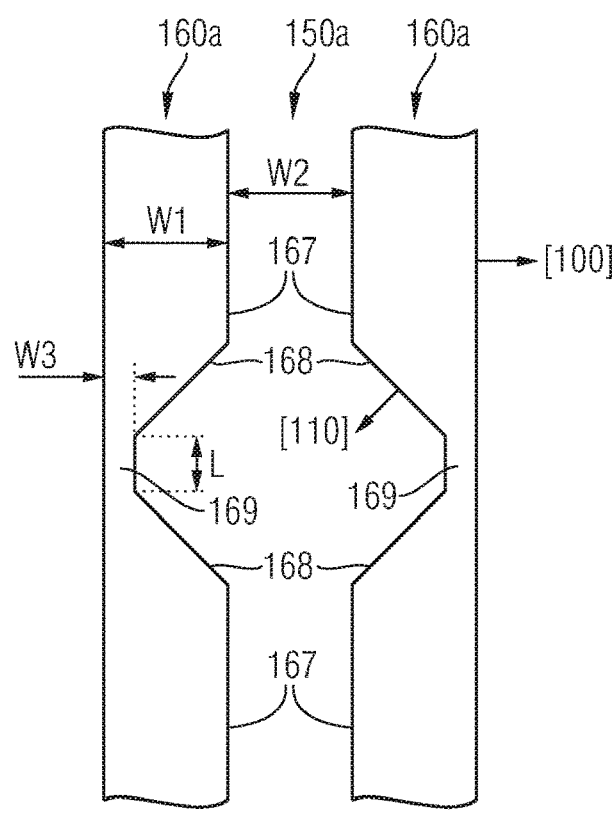
FIG. 13D is a schematic plan view of a layout for precursor semiconductor mesas according to an embodiment providing constricted portions between one-sided tapering portions.

The precursor semiconductor mesas 160a in FIG. 13D include tapered portions 168 with one-sided tapering. Narrow portions of constriction width W3 and a length L between two adjoining mirror-inverted one-sided tapering portions 168 form the constricted portions 169. By providing pairs of neighboring precursor semiconductor mesas 160a with one-sided tapered portions 168 mirror-inverted with respect to a longitudinal center axis of the intermediate electrode trench 150a, both width and depth of the electrode trench 150a can be locally increased. The precursor semiconductor mesas 160a can be oxidized to a depth greater than the vertical extension of the precursor semiconductor mesas 160a outside the constricted portions 169.

Figure 13E:
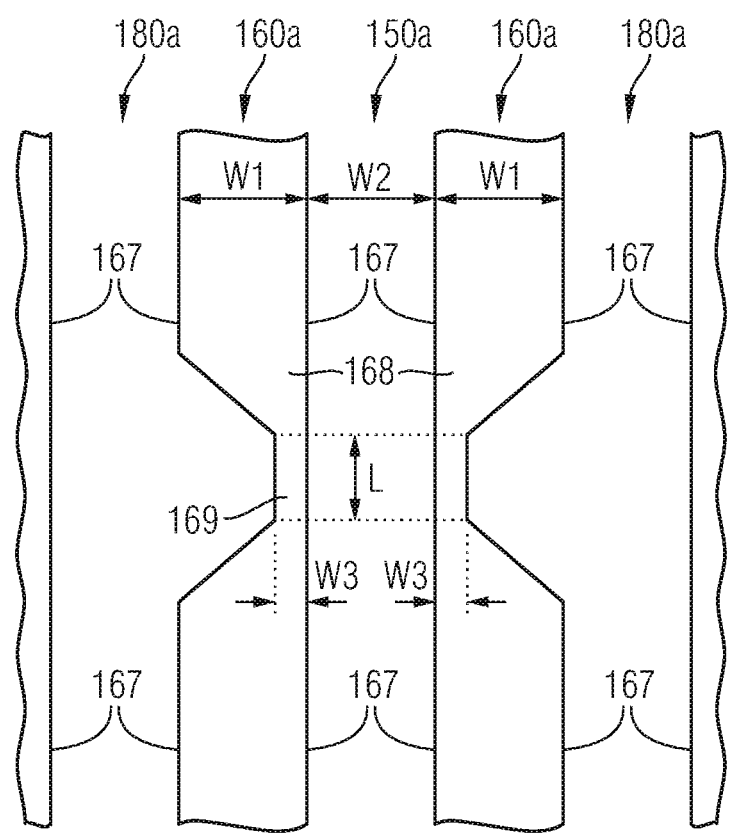
FIG. 13E is a schematic plan view of another layout for precursor semiconductor mesas according to an embodiment providing constricted portions between one-sided tapering portions.

In FIG. 13E two precursor semiconductor mesas 160a are arranged mirror-inverted with respect to a longitudinal center axis through an intermediate electrode trench 150a, wherein the constricted portions 169 are arranged opposed to each other and the intermediate electrode trench 150a has straight sidewalls.

In FIGS. 13F to 13H two parallel mesa branches 161 form the constricted portions 169, respectively, wherein each mesa branch 161 may have a branch width W5, which is narrower than the mesa width W1. Each of the parallel mesa branches 161 connects two portions 167 of mesa width W1. The precursor semiconductor mesas 160a are comparatively stable during a process phase after etching the electrode trenches 150a and before filling the electrode trenches 150a.

In FIG. 13F, due to the smaller width W4 of the portions of the electrode trenches 150a adjoining the mesa branches 161, the precursor semiconductor mesas 160a can be oxidized only to a depth lower than the vertical extension of the semiconductor mesas outside of the constricted portions 169.

FIG. 13G refers to an embodiment that differs from the embodiment of FIG. 13F in that the width W4 of the portions of the electrode trenches 150a adjoining the mesa branches is wider than the electrode width W2. Due to the greater width W4 of the portions of the electrode trenches 150a adjoining the mesa branches 161, the precursor semiconductor mesas 160a can be oxidized to a depth deeper than the vertical extension of the semiconductor mesas outside of the constricted portions 169.

In FIG. 13H the mesa branches 161 are formed such that the electrode width W2 remains approximately unaltered and straight oxide structures are formed along the electrode trenches 150a.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor mesa comprising source zones arranged along a longitudinal axis of the semiconductor mesa and separated from each other along the longitudinal axis, the semiconductor mesa further comprising at least one body zone forming first pn junctions with the source zones and a second pn junction with a drift zone, first portions of the at least one body zone being formed in a vertical projection of the source zones with respect to a top surface of the semiconductor mesa;
   continuous stripe-shaped electrode structures on opposite sides of the semiconductor mesa; and
   a separation region between two of the first portions of the at least one body zone,
   wherein longitudinal axes of the electrode structures run parallel to the longitudinal axis of the semiconductor mesa,
   wherein at least one of the electrode structures comprises a gate electrode configured to control a charge carrier flow through the at least one body zone,
   wherein in the separation region, at least one of (i) a capacitive coupling between the gate electrode and the semiconductor mesa and (ii) a conductivity of majority charge carriers of the drift zone is lower than outside of the separation region.

2. The semiconductor device of claim 1, wherein the semiconductor mesa is a portion of a semiconductor body, wherein the source zones directly adjoin a first surface of the semiconductor body, and wherein the drift zone is formed in the semiconductor body between the at least one body zone and a second surface opposite to the first surface.

3. The semiconductor device of claim 1, further comprising:
   contact structures of a conductive material directly adjoining the semiconductor mesa outside of the separation region and within the separation region.

4. The semiconductor device of claim 1, wherein the gate electrode is absent in the separation region.

5. The semiconductor device of claim 1, wherein in the separation region, a gate dielectric between the gate electrode and the semiconductor mesa is thicker than outside the separation region.

6. The semiconductor device of claim 5, wherein the semiconductor mesa comprises straight sections extending along a first lateral direction and slanted sections, and wherein the slanted sections extend in a direction intersecting the first lateral direction and connecting the straight sections.

7. The semiconductor device of claim 1, wherein in the separation region, the semiconductor mesa comprises a semiconducting connecting portion connecting portions of the semiconductor mesa that comprise the source zones.

8. The semiconductor device of claim 2, wherein the separation region comprises at least one dielectric separation structure directly adjoining at least one of the electrode structures, projecting into the semiconductor mesa, and extending from the first surface of the semiconductor body to at least the second pn junction.

9. The semiconductor device of claim 2, wherein each separation region comprises at least two dielectric separation structures and an auxiliary mesa between the at least two dielectric separation structures, and wherein the at least two dielectric separation structures adjoin both electrode structures, project into the semiconductor mesa and extend from the first surface of the semiconductor body to at least the second pn junction.

10. The semiconductor device of claim 9, wherein in the auxiliary mesa, a net impurity concentration changes with increasing distance to the source zones.

11. The semiconductor device of claim 9, wherein the auxiliary mesa is electrically connected to a first load electrode directly connected to the source zones.

12. The semiconductor device of claim 1, wherein second portions of the body zones separate the source zones from the separation regions.

* * * * *